US011842782B2

(12) United States Patent
Bryan

(10) Patent No.: US 11,842,782 B2
(45) Date of Patent: Dec. 12, 2023

(54) PHASED PARAMETERIZED COMBINATORIC TESTING FOR A DATA STORAGE SYSTEM

(71) Applicant: EMC IP Holding Company LLC, Hopkinton, MA (US)

(72) Inventor: Matthew Bryan, Olympia, WA (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 205 days.

(21) Appl. No.: 17/491,080

(22) Filed: Sep. 30, 2021

(65) Prior Publication Data
US 2023/0094854 A1 Mar. 30, 2023

(51) Int. Cl.
G11C 29/00 (2006.01)
G11C 29/10 (2006.01)
G06F 9/48 (2006.01)

(52) U.S. Cl.
CPC ............ *G11C 29/10* (2013.01); *G06F 9/4881* (2013.01)

(58) Field of Classification Search
CPC .............................. G11C 29/10; G06F 9/4881
USPC ........................................ 714/718, 722, 738
See application file for complete search history.

(56) References Cited

U.S. PATENT DOCUMENTS

| 4,477,902 A * | 10/1984 | Puri ................. G01R 31/31937 714/724 |
| 6,735,730 B1 * | 5/2004 | Fujiwara .......... G01R 31/31724 714/724 |
| 7,266,743 B2 * | 9/2007 | Athavale ........ G01R 31/318594 714/733 |
| 7,482,164 B2 * | 1/2009 | Vincent .................. G01N 31/10 422/78 |
| 8,219,349 B1 * | 7/2012 | Schwarz ................. H01L 22/20 700/121 |
| 8,862,940 B2 * | 10/2014 | Qiu ..................... G06F 11/3608 714/33 |

(Continued)

OTHER PUBLICATIONS

Docs.pytest.org, "Parametrizing tests," © Copyright 2015-2020, holger krekel and pytest-dev team. Created using Sphinx 3.5.4., https://docs.pytest.org/en/6.2.x/example/parametrize.html, Retrieved from the Internet: Sep. 5, 2023.

(Continued)

*Primary Examiner* — Albert Decady
*Assistant Examiner* — Osman M Alshack
(74) *Attorney, Agent, or Firm* — Amin, Turocy & Watson, LLP

(57) ABSTRACT

Phased parameterized combinatoric testing for a data storage system is disclosed. A testing recipe can be performed according to different input arguments. Combinatoric testing of the data storage system can be based on different combinations of operations and arguments. The disclosed testing can employ a consistent integer index for arguments passed into the sequenced operations of the recipe. The recipe can be employed to generate a phased test tree that can enable testing based on a phase rather than loading an entire test suite into memory. The consistent integer index can be used to identify failed test cases such that the entire test can be reconstituted from stored failed test information. Distribution of test cases to worker process can based on the phased test tree to facilitate interning an operation. Stored failed test information can include human-readable failure information.

20 Claims, 10 Drawing Sheets

(56) References Cited

U.S. PATENT DOCUMENTS

| | | | | |
|---|---|---|---|---|
| 9,208,064 | B2* | 12/2015 | Fryč | G06F 11/3684 |
| 10,754,764 | B2* | 8/2020 | Lekivetz | G06N 3/084 |
| 2014/0047275 | A1* | 2/2014 | Eddington | G06F 11/0766 |
| | | | | 714/37 |
| 2015/0046906 | A1* | 2/2015 | Segall | G06F 11/3688 |
| | | | | 717/124 |
| 2018/0052763 | A1* | 2/2018 | Green | G06F 11/3684 |
| 2018/0224502 | A1* | 8/2018 | Champoux | G01R 31/3177 |
| 2019/0179735 | A1* | 6/2019 | Krasko | G06F 11/3688 |
| 2020/0173889 | A1* | 6/2020 | Dar Mousa | G06F 11/3676 |
| 2020/0183817 | A1* | 6/2020 | Scholz | G06F 11/3692 |
| 2021/0124858 | A1* | 4/2021 | Morgan | G06F 30/23 |

OTHER PUBLICATIONS

Github.com, "xdist: pytest distributed testing plugin," https://github.com/pytest-dev/pytest-xdist/blob/e37039ee416ef97b63c3e52b1b22438e820e9a40/README.rst#making-session-scoped-fi, Retrieved from the Internet: Sep. 5, 2023.

Csrc.nist.gov, "Combinatorial Testing," https://csrc.nist.gov/Projects/automated-combinatorial-testing-for-software/acts-library/papers, Retrieved from the Internet: Sep. 5, 2023.

* cited by examiner

PHASED PARAMETERIZED COMBINATORIC TESTING FOR A DATA STORAGE SYSTEM

BACKGROUND

Conventional testing of complex software products like distributed data storage systems generally requires testing of a cross-product of many system configurations, system states, operation types, and operation parameters. Experience has shown that an effective way to test these complex state-action spaces can be to systematically generate test cases in an automated way, sampling single test cases from each functionally distinct class in that subset. This can be referred to as 'combinatoric test case generation', which has proven to be necessary in some test scenarios where both hardcoded tests and fuzz tests can fall short.

DETAILED DESCRIPTION

Figure 1:
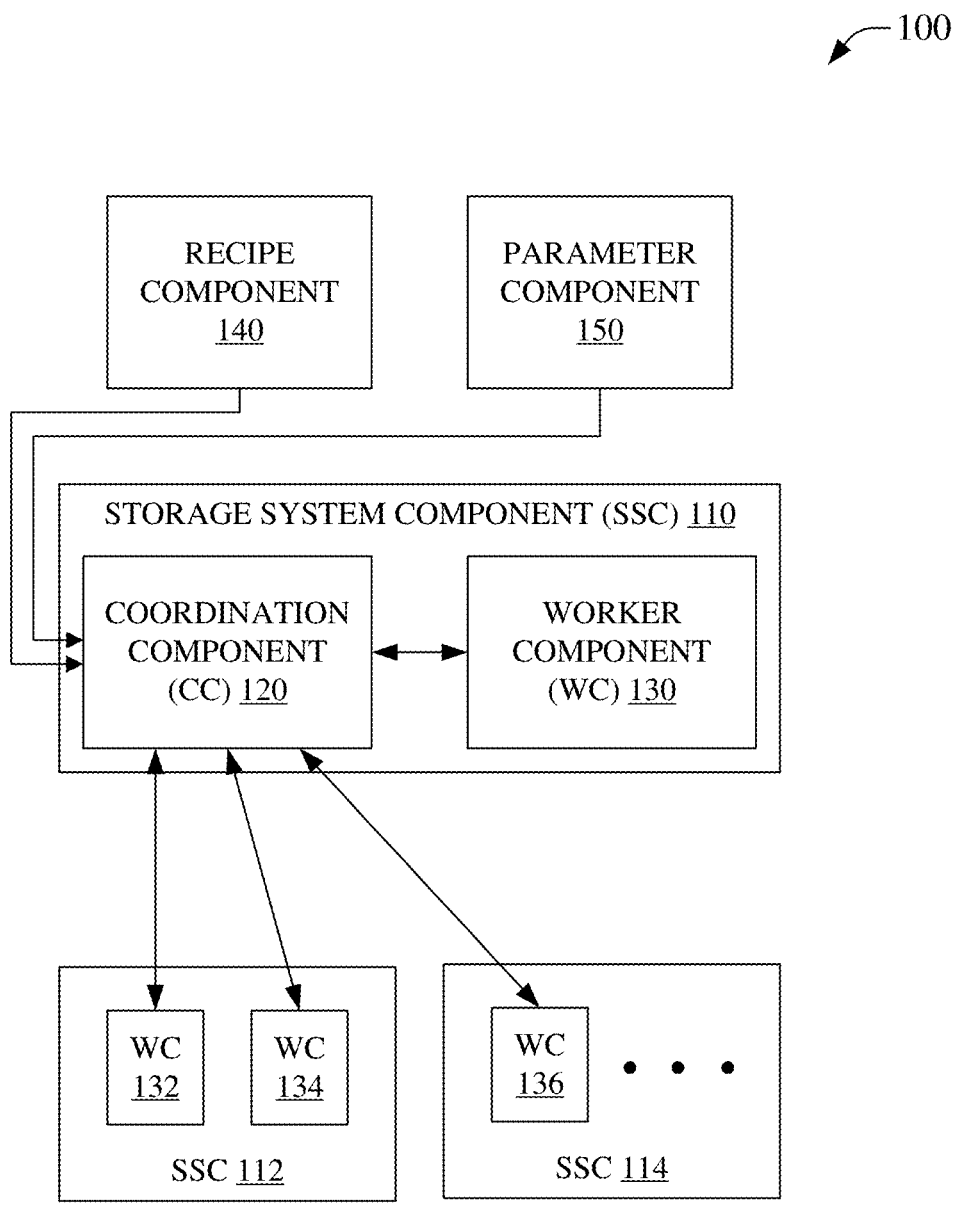
FIG. 1 is an illustration of an example system that can facilitate parameterized testing of a data storage system, in accordance with aspects of the subject disclosure.

The subject disclosure is now described with reference to the drawings, wherein like reference numerals are used to refer to like elements throughout. In the following description, for purposes of explanation, numerous specific details are set forth in order to provide a thorough understanding of the subject disclosure. It may be evident, however, that the subject disclosure may be practiced without these specific details. In other instances, well-known structures and devices are shown in block diagram form in order to facilitate describing the subject disclosure.

Conventional hardcoded tests and fuzz tests can fail to adequately test modern data storage systems, e.g., they can fail to present easily understood results, they may not adequately test some parameters, they can fail to be memory and processor friendly in large data storage systems with many variable attributes, they can lack the ability to rapidly focus tests, etc. Combinatorial testing tests these complex state-action spaces systematically and in an automated way, e.g., sampling single test cases from each functionally distinct class in that subset. Combinatorial testing, which can also be referred to as 'combinatoric testing' for short, can solve some of the deficiencies of other types of storage system testing regimes. The testing technology disclosed herein can leverage combinatoric testing fundamentals to provide beneficial advantages that can include lower computing resource demands, e.g., lower orders of memory consumption, processor usage, networking usage, etc. Moreover, the disclosed subject matter can generate meaningful results that can be readily updated to provide further testing efficacy, e.g., human-readable test results that can be easily modified to do additional testing to better characterize failure points, bugs, etc.

The disclosed subject matter can provide combinatorial generation of, and executing of, test cases in a manner that can offer many benefits over other conventional testing technologies. These desirable benefits can include O(log n) memory use in the number of tests being run. This benefit is highly desirable where a system under test (SUT), e.g., a data storage system or portion thereof, can be complex, e.g., the SUT can have a high dimensional state-action space. In some test embodiments of the disclosed subject matter, testing on the order-of one-million test cases per hour were performed with a minimal memory footprint. Another advantage of the disclosed subject matter can include the ability to parallelize generating and running test cases. This paralleled testing can directly comprise synchronization patterns. As an example: a suite level fixture can be executed in the middle of a full test suite, wherein a prior 'phase' of the test suite, which can be executing in parallel, and can be guaranteed to finish prior to the suite level fixture being executed. After the suite level fixture completes, subsequent phases of the full tests can be released to again run in parallel. This can provide extraordinary testing efficiency that is not generally found in sequential testing techniques. Yet another advantage of the disclosed subject matter can include representing all of the logic of a test as a single integer and employing a 'recipe' to generate a testing suite. This can result in a highly storage-efficient representation of test results and can still allow deterministic test run replays in an O(1) CPU time order. Additionally, a human readable script can be recovered from the from a recipe and a corresponding single integer. This human readable script can precisely explain the associated case's test logic. Embodiments of the disclosed subject matter can be appreciated as enabling efficient use of computing resources, e.g., memory, processor operations, network communication etc.

As such, the disclosed subject matter can be appreciated as improving scalability and flexibility of combinatoric test case generation, while also offering benefits via parallelization patterns for a test framework. These benefits, in testing, have proven to be important factors for filesystem testing in large data storage systems, including distributed data storage systems. The disclosed subject matter can base a representation of a test suite on a pseudo-tree structure, e.g., a 'test phase prefix tree', hereinafter typically referred to as 'a tree' for clarity and brevity. A tree can be iterated over in O(1) memory use order. This can be achieved by storing just the actively iterated portions of a tree in memory at any given time, in comparison to the much more memory hungry practice of storing an entire tree in memory. A test recipe can then iterate in O(log n) count of test cases, and generally, the constants of O(log n) being very low, typically based on 'sizeof(int)' values. Moreover, a single test case can be recovered and replayed in O(1) in both memory and CPU time. It is noted that a user entity can employ a simple application programming interface (API) to specify recipes of test cases. These recipes can then be stored to vastly simplify reuse of code. Test case execution can be parallelized and/or distributed to compensate for the generally very large number of test cases resulting from combinatoric test case generation. Synchronization point logic can be achieved by quiescing parallel processes prior to performing serial operations, e.g., a serial operation can act as a synchronization point for other paralleled operations of the test suite. It is noted that serial operations can be parameterized in a manner similar to non-serial operations. In this regard parameterized serial operations can result in additional branching of a tree model of the testing, however, branching of parameterized serial operations is constrained in that groups of serial operations must be run sequentially with regard to each other and, in addition, to running serially with regard to the other non-serial operations. It will be appreciated that representing a test case's logic as a single integer, and using a recipe to generate the suite, can enable replaying individual test cases in an on-demand fashion, e.g., without enumerating the whole suite of cases, and the replay therefore does not require loading an entire test suite into memory in a manner that does not scale well to large test suites. These benefits are substantially different from conventional test frameworks.

To the accomplishment of the foregoing and related ends, the disclosed subject matter, then, comprises one or more of the features hereinafter more fully described. The following description and the annexed drawings set forth in detail certain illustrative aspects of the subject matter. However, these aspects are indicative of but a few of the various ways in which the principles of the subject matter can be employed. Other aspects, advantages, and novel features of the disclosed subject matter will become apparent from the following detailed description when considered in conjunction with the provided drawings.

FIG. 1 is an illustration of a system 100, which can facilitate parameterized testing of a data storage system, in accordance with aspects of the subject disclosure. System 100 can comprise storage system component (SSC) 110 that can comprise storage devices enabling storage of data. SSC 110 can be comprised in a storage system. Similarly, SSCs 112, 114, etc., can be comprised in a storage system, for example, SSCs 110, 112, 114, etc., can be comprised in a geographically diverse data storage system, for example a storage system comprising storage devices in different data centers, different cities, different states, different countries, different hemispheres, etc.

A command to perform a test suite can cause coordination component 120 of SSC 110 to initiate a test suite. As an example, a test suite can be called via a function, such as, calling Run(recipe=[OpClass1, OpClass2, . . . ]), where a recipe argument comprises a list of operation classes, such as OpClass1, OpClass2, etc. An operation class can generally be referred to simply as an operation and can be code that can be executed in the test suite. An operation can be executed in parallel with other operations. A serialized operation, generally referred to as a serial operation or similar term, e.g., serial operation(s) 410, 510, 512, etc., can be an operation instance that must be executed serially with regard to all other operation instances. As such all serial operations are operations, but not all operations are serial operations and, moreover, serial operations are defined as not being able to be performed in parallel within the test suite.

In embodiments of the disclosed subject matter, a 'recipe' can be used to generate test cases comprised in a given suite of tests. A recipe can be a sequence of operation classes and corresponding parameters. Tests generated can be regarded as a cross-product of different operations and their provided parameters, which can result in each test case representing a unique sequence of parameterized operations. In some embodiments, a test case can correspond to a unit of 'state', which can be something the test case operates on, such as a file, etc. As such, in these embodiments, a state can also be passed to operation calls comprised in the test. In this regard, tests can be thought of as having 'phases,' wherein any operations of a phase can be run in parallel. It is noted that running in parallel can allow some branches of tests to race ahead, which is permitted, so long as the operations of that branch of tests are performed in order. Further, even where some test cases may race ahead while following operations order, all operations are required to finish before commencing a next phase, e.g., a phase can comprise a synchronization point that allows all running test cases to reach the synchronization point before any of them are allowed to proceed to a next phase of the test. In embodiments, a serial operation can act as a synchronization point. In these embodiments, all tests of a phase can run to completion of the phase but cannot undergo the serial operation until all operations have completed the phase.

As such, system 100 can comprise recipe component 140 that can source a test suite recipe to CC 120. Moreover, recipe component 140 can facilitate accessing, storage, sorting, ranking, updating, modifying, merging, etc., of test suite recipes. As an example, a user can save multiple recipes during a week of testing a storage system. In this example, the several recipes can be marked with a score by the user related to how well the user felt the recipe worked. Further, in this example, at a later time the recipes that were saved and scored can be ranked according to that score and the best recipe can be retrieved. The example retrieved recipe can be modified by the user, e.g., the retrieved recipe can act as a 'previously liked recipe' that can be a template for a new recipe that the user intends to implement for further testing the storage system after some recent modifications. System 100 can further comprise parameter component 150 that can facilitate access to parameters. Moreover, parameter component 150 can also facilitate accessing, storage, sorting, ranking, updating, modifying, merging, etc., of test suite parameters. As stated elsewhere herein, a parameter can be indicated in a recipe, for example, as an integer. As such, the integer can correspond to a stored parameter. As an example, a parameter can be '1' in an operation ["write", 1, 4133]. The '1' parameter can be correlated to a pattern of data to be written into an open file. The pattern of data can be accessed via, stored by, etc., parameter component 150 to enable CC 120 to pass the parameter to worker components (WCs) that can then use the pattern of data in the example write operation.

System 100 can comprise worker components, e.g., WC 130, 132, 134, 136, . . . , etc. In embodiments a WC can be embodied in computing resources committed to performing operations of the test suite recipe at one or more SSCs, e.g., SSC 110, 112, 114, etc., of a storage system. Workers can communicate via a network or other communications framework, e.g., communications framework 940, etc., with CC 120. Typically, WCs do not communicate to other WCs and, as such, can avoid sharing any global state, avoid locking between WCs, and synchronization can be managed by CC 120 rather than among the WCs. Similarly, in this regard, CC 120 is generally a single process running on a single node, wherein an entry point of a test run can invoke CC 120, that in turn can sets up and run the tests of a test suite recipe. It is noted that in some embodiments, CC 120 and WC 130 can be comprised in a same component without departing from the scope of the subject disclosure. Further, an SSC can comprise more than one WC in some embodiments, e.g., there can be one or more threads per worker process, wherein each thread can be responsible for executing portions of tests in the one or more WCs. Accordingly, separate processes can run on a same machine via multithreading, while in other embodiments, multiple CPUs across different physical storage node devices can support different WCs, e.g., distributed storage system nodes.

Figure 2:
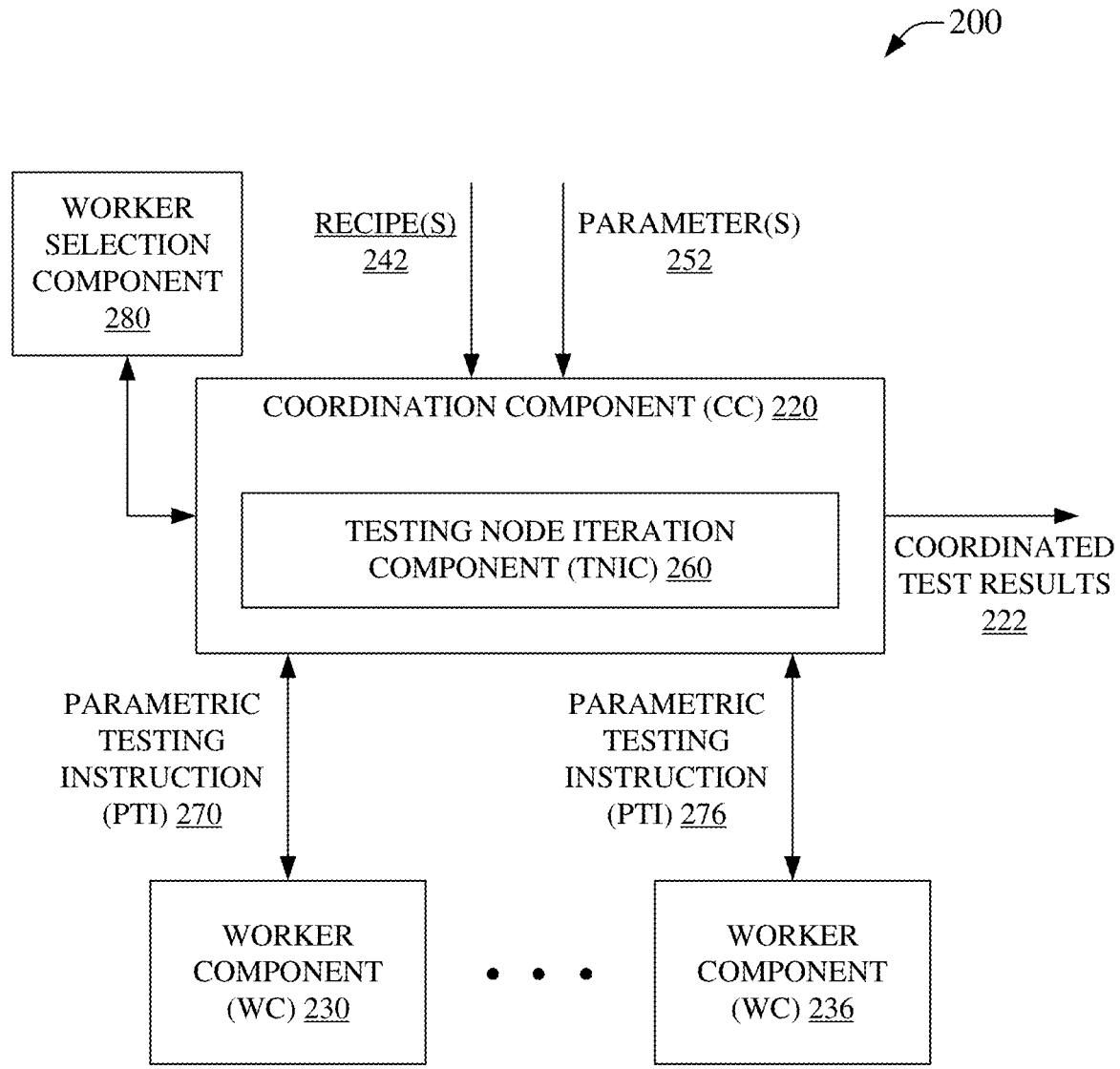
FIG. 2 is an illustration of an example system enabling parameterized testing with synchronization points for a data storage system, in accordance with aspects of the subject disclosure.

FIG. 2 is an illustration of an example system 200 enabling parameterized testing with synchronization points for a data storage system, in accordance with aspects of the subject disclosure. System 200 can comprise CC 220 that can be comprised instantiated in any SSC of a storage system. As is previously noted, a storage system can comprise storage devices in a local or distributed topology, e.g., a storage system can comprise storage devices in different data centers, different cities, different states, different countries, different hemispheres, etc. CC 220 can receive recipe(s) 242 and can access parameters(s) 252. CC 220 can determine distribution of testing work to workers of one or more of WC 230, 236, etc., e.g., parametric testing instruction(s) PTIs 270, 276, etc., can be communicated to WCs 230, 236, etc., to enable corresponding computing resources, e.g., worker(s), to perform test cases.

CC 220 can comprise testing node iteration component (TNIC) 260. TNIC 260 can determine a phase of a test suite. The phase of the test suite can correspond to a portion of a test tree topology, for example, see parameterized testing nodes (PTNs) 4001, 4002, 4003, and 4004 of example system 400, that can correspond to a first phase of an example test suite, e.g., occurring before the synchronization point associated with serial operation(s) 410. In this example, the operations at PTN 4001-4004 must finish before serial operation(s) 410 can occur and system 400 can only then move on to a second phase corresponding to PTNs 4017-4052. TNIC 260 can parse a recipe comprised in recipe(s) 242 to determine operations of the example first phase. TNIC 260 can then enable distribution of PTIs, e.g., PTIs 270-276, etc., to selected WCs, e.g., WCs 230-236. In the preceding example, WCs 230-236 can correspond to WCs 430-436 in system 400 of FIG. 4. It is noted that TNIC 260 can consume limited computing resources based on a current relevant phase of the test suite. In the preceding example, computing resources to accommodate operations for PTNs 4001-4004 can be consumed without consuming additional computing resources for other phases, e.g., TNIC 260 can avoid consuming computing resources for PTNs 4017-4052, etc., while the test suite is still in the first phase of the test suite. This can drastically improve computing resource consumption, more especially as the testing suite scales to larger storage systems where, for example, there can easily be millions of test cases in a given phase and it can be wasteful to burden computing resources for an entire tree in comparison to just burdening computing resources corresponding to an active phase of a test suite as is disclosed herein.

As is illustrated in example system 200, CC 220 can coordinate performance of the test suite and WCs 230-236, etc., generally do not communicate with each other. Accordingly, CC 220 can receive results from WCs 230-236, etc., can enable access to coordinated test results 222. Workers can communicate via a network or other communications framework, e.g., communications framework 940, etc., with CC 220. Limiting WCs 230-236, etc., to communicating with CC 220 can avoid sharing any global state between WCs, avoid locking between WCs, and synchronization of testing can be managed by CC 120 directly. However, there can be embodiments where communication between WCs is permittable. CC 220 can enable WCs 230-236, etc., to receive PTIs 270-276, etc., wherein a PTI can comprise an in-order operation(s) and parameter. A worker process at a WC can then perform the operation(s), again in order up to a synchronization point, and can access a value corresponding to the parameter, for example, a worker can 'look up' a parameter value via a parameter component such as parameter component 150. Additionally, PTIs can, where appropriate, comprise state information. Further PTIs can comprise a unique test identifier. The test identifier can correspond to the combinatorial characteristics of the particular test case. As an example, for a test suite having three variables that correspondingly have two, four, and six degrees of freedom, e.g., [1-2,1-4,1-6], there can be a total of 2*(4*6)=48 combinations of those parameters, e.g., from [1,1,1] to [2,4,6]. In this example, an example write operation, e.g., [write, 1, (2,3,4)], can write information based on the parameter '1' into an open file corresponding to the [2,3,4] combination test values. Similarly, a second example write operations, such as [write, '3', (1,1,6)] can write information based on the parameter '3' into another open file corresponding to the [1,1,6] combination test values. In these example, the open files corresponding to the (2,3,4) test and the (1,1,6) test can be at the same storage device, at different storage devices in a same location, at different storage devices in different locations, etc. Similarly, worker processes for the example (2,3,4) test and the (1,1,6) test can be the same or different worker processes and can be performed on the same or different computing resources that can be located locally or remotely from each other. As an example, the (2,3,4) test can be performed in Seattle, for a file located on a storage device in Seattle, and the (1,1,6) test can be performed in Boston, for a file at a storage device in New York City.

In embodiments, a suite of tests can therefore be generally represented in a pseudo-prefix tree. However, rather than representing an entire tree explicitly, as is conventionally done with tree topology models, the disclosed subject matter can represent portions of a tree, e.g., via TNIC 260 iteratively generating a current active portion of the tree. Accordingly, TNIC 260 can iterate over levels of the tree to chunk each level into portions for workers to execute, and can associate the resulting PTNs, with corresponding test cases via use of a consistent integer index, e.g., example test (2,3,4) can be associated with a first PTN and example test (1,1,6) can be associated with a second PTN, etc. The use of the constant integer index of test cases can result in memory usage that can be O(k) in the number of operation classes, rather than O(n) in the number of test cases. It is noted that typical real-world use cases can represent a test suite effectively O(log n), rather than O(n), in the number of test cases, e.g., 'k' can typically be about 'log n' rather than 'n'. In real world storage system testing, this smaller memory footprint can be quite important to testing of larger storage systems that can have massive numbers of PTNs and similarly massive numbers of test cases in a test suite, e.g., loading only phase-relevant tests into memory can be vastly superior to loading all test cases into memory.

Additionally, using TNIC 260 iteratively generating a current active portion of the tree employing a constant integer index for test cases also allows interning of a representation of corresponding test operations that can be shared between worker threads. By expanding an operation comprised in a PTI once, and then reusing the expanded operation for other worker threads, where possible, further computing resource savings can be achieved, e.g., memory savings, networking/bandwidth savings, etc.

Moreover, a unique index for an example test case, e.g., (2,3,4), (1,1,6) from other examples herein, can be passed to any other test operation. In this regard, additional memory resources can be saved via storing a corresponding 'state' for the uniquely indexed test case out-of-band, e.g., on disk rather than in memory. As an example, a test may operate on an open file at a designated path e.g., '/ifs/data/N.dat', where N is a unique test case index and, accordingly, the state does not have to be saving in memory where it can be read from the designated path. State storage corresponding to a unique test case index can support a testing framework that can have a sublinear memory order in the number of test cases while still supporting per-test state retention.

Leaf nodes of the test suite tree topology can therefore represent individual test cases having unique constant integer indexes. A walk down the tree from the root to a leaf can uniquely define operation instances comprised in that specific test case. As an example, in system 300, PTN 3019 can have operations that are different than those in PTN 3022, which can be different than those in PTN 3050, etc. In this regard, the sequence of operations to reach any leaf, e.g., the sequence of particular parameterized operations between a root and a leaf, can be the same, similar, or quite different, however, even where they are the same operations, those operations can employ different parameters. It is noted that the parameterization of an operation into a branch of a tree model iteratively executes the same operation but with different arguments in each permutation, e.g., in system 300, PTN 3001 to 3004 can all be a same operation being iteratively performed, e.g., as different instances, each with different input arguments such that each of PTN 3001-3004 is a distinct parameterized operation. In an analogy, an operation can be 'X+1', and X can have two degrees of freedom, e.g., X=1 and X=4, whereby injecting the X=1 argument into a first instance of operation can result in a first PTN, e.g., a first operation can be '1+1', and injecting the other argument X=4 into a second instance of the same operation can result in a second PTN, e.g., a second operation can be '4+1'. In an example, in system 300, a write operation can be performed at each of PTN 3001-3004, however, even though all four PTNs in this example perform a write operation, the parameter of the write operation can be different at each of PTN 3001, 3002, 3003, and 3004. Moreover, any leaf of the branch passing through PTN 3001 can therefore be regarded as being distinct in operation/parameter combination from every leaf of the branches via PTN 3002, 3003, 3004, etc. Within a tree representation of the test suite, a horizontal level of the tree can be regarded as corresponding to a given phase of tests, wherein the test phase, as has been disclosed elsewhere herein, can be viewed as a portion of a test suite comprising an ordered operation/parameter combinations. A serial operation can act as a synchronizing point between phases of a tree. Accordingly, levels of the tree can be regarded as representing breaks in the tests where serial operations can occur. In this regard, tests of a phase can execute, quiescing all outstanding work at the end of a given phase, whereby CC 220 can then run a next serial operation on all of the remaining tests from the end of the example phase.

TNIC 260 can generate parts of the tree structure, e.g., phases, on-the-fly, which can correspond to sending PTIs to workers of WCs. Accordingly, the test suite tree does not exist in its entirety in memory at any point in time, rather only phases of the tree are put into memory while they are relevant to the testing. Further, CC 220 can release from memory, portions of the tree that are no longer relevant to the CC 220 coordinating the testing, e.g., CC 220 can release portions of memory after corresponding testing work has been communicated to relevant worker processes of WCs. PTNs can contain, via PTIs, e.g., PTI 270, 276, etc., sufficient information for a corresponding worker process to consistently hash each unique test case under it by an index that can indicate a number of times to run the operations contained in the PTN. Moreover, PTIs can indicate states for tests to be runs. A PTI can be regarded as a compact representation that enables sublinear memory use on both the coordinator side, e.g., CC 220, etc., and worker sides, e.g., WC 230, 236, etc. PTIs can also saves a significant amount of communications overhead, e.g., network computing resources, for example, by sending a given parameterization of the current phase to a given worker only once, rather than for every single test case as might be done conventionally.

In embodiments of the disclosed subject matter, all phases of a given test can be executed by a same worker, e.g., in system 400, WC 430 can run all of the test cases for the PTN 4001 and 4002 branches. A test case state can therefore be kept in the memory, or on disk storage, etc., for a worker without needing to endeavor in the complexities of passing state between nodes, e.g., WC 430 can keep the states for test cases of branches under PTN 4001 and 4002. In system 200, CC 220 can manage WC assignment of test cases. Additionally, worker selection component 280 can support distribution of test cases among WCs. In some embodiments, test cases can be assigned in a round-robin manner in an attempt to distribute work more evenly in a system under test (SUT). However, other techniques for assigning PTNs to WCs can be employed, for example, first available WC, logical or physical distance from CC 220, etc. In some embodiments, worker selection component 280 can facilitate targeted assignment of PTNs to WCs. As an example, where testing of storage system can be attempting to heavily burden newly added storage components that have had comparatively less historical testing than existing storage system devices, worker selection component 280 can specifically direct PTNs to WCs on newly added storage system components. This can, in an example, occur to the extent that the newly added storage is much more heavily burdened than other existing storage devices. In this example, worker selection component 280 can facilitate stress testing of the newly added devices by disproportionately placing PTNs on corresponding WCs. Generally, work can be balanced between WCs by slicing the test suite tree vertically, for example, as is illustrated in system 400 where WC 430 comprises PTNs for two branches, WC 432 comprises PTNs for another branch, an WC 436 comprises PTNs for yet a different branch of the test suite. It is noted that in example system 400, the workers remain consistent even between different phases of testing, e.g., the PTN 4001 branch remains in WC 430 at the first phase associated with PTN 4001 and in the second phase associated with PTNs 4017-4025, e.g., test indices within a given range can be consistently assigned to a corresponding WC. Whereas tests can be indexed all the way down a tree across iterated phases, the WC can be easily determined and sent corresponding work. This can avoid a need to store relationships between a worker and every individual test case in memory in order to accommodate routing because the unique consistent indexing can ensure that branches between a leaf and a root propagate to the same WC, e.g., state can be stored out-of-band. The tree space can be split based on the cardinality of the tree root and the count of available worker processes in the SUT, wherein consistently hashing a given test index by TNIC 260 can direct PTI to the same worker ID from root to a specific leaf as TNIC 260 traverse down the tree.

In embodiments, the tree can be pruned, e.g., based on test case failures. Indices of failed test cases can be tracked, along with the operation the test case failed on. This is sufficient information to recover a full log of the test because non-recorded tests can be tests that did not fail. A worker communicates failures, e.g., the indices of a failed test and operation identification, back to CC 220. The worker will then avoid running subsequent phases of the failed case, e.g., the tree is pruned at the failed PTN. The presently disclosed testing is truly deterministic, such that if a given test fails during a phase, then all other tests under the same node must also fail at the same phase, because those tests logic to that node are identical to the failed test. In some embodiments, a test and a SUT can be non-deterministic, in these embodiments, pruning of a single test case is supported, which can be in lieu of more broadly pruning branches of the whole tree rooted at a failure point. In terms of memory consumption, a worst-case scenario of all tests failing can result in the list of failed test indices being O(N) in the number of test cases, e.g., every test case has failed so every test case is identified in memory. However, typically not all tests will fail, and the memory consumption can be less. Moreover, even large number of failures, in view of aggressive tree pruning and the relatively small storage space for indexing and parameter integers, can result in not actually storing a great volume of data, even though this compact information is sufficient to reconstruct the entire test. Further, pruning in memory can be disabled causing failure to be instead written to disk and little to no memory can be consumed to store failed PTN information. It is noted that the disclosed pruning technique can result in O(1) memory for results where there are no test case fails, e.g., a best-case scenario, but can be, in a worst-case scenario of all test cases failing, O(N) memory for results, which is consistent with many typically testing frameworks. As such, the disclosed pruning can generally be as good as, or better than conventional result memory consumption techniques.

Coordinated test results 222 can comprise failed test case information, e.g., failed tests at PTNs. This can include failed branch nodes, leaf nodes, or combinations thereof. Coordinated test results 222 can therefore indicate the index and operation for the failed case, enabling recreation of a failed test. This recreation can be O(1) in both memory and CPU time, e.g., iterating across an entire parameter set to reach the leaf is not required to recreate the failed test, rather the test operation can be directly calculated based on the index and parameters. Moreover, coordinated test results 222 can be created in a human readable representation of the test behavior based on the index of the failed PTN where there is an appropriate way to indicate parameters of the operations for the failed PTN. The human readable representation can be leveraged to do further testing based on the failed test case, e.g., a user can understand the failed operation and parameters and can therefore implement additional testing to better flesh out bugs, failure points, etc. As an example, the same series of operations from a failed test case can be re-run, but some steps can be altered, some parameters changed, etc., in order to find a more precise characterization of a bug, e.g., the original or modified human-readable script can be passed back as a further specification for a test.

Figure 3:
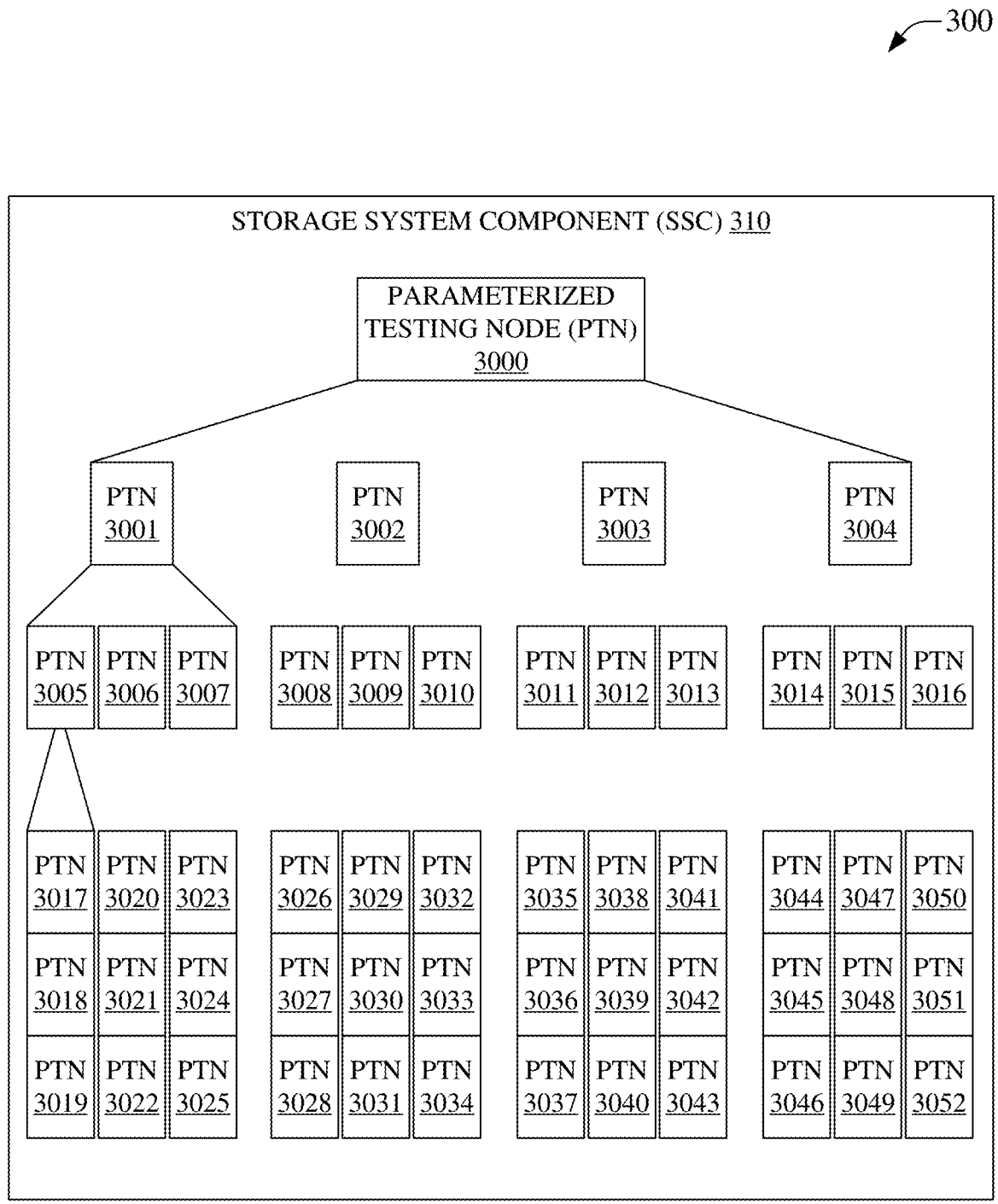
FIG. 3 illustrates an example system that can enable parameterized combinatoric testing of a data storage system, in accordance with aspects of the subject disclosure.

FIG. 3 is an illustration of a system 300, which can facilitate parameterized combinatoric testing of a data storage system, in accordance with aspects of the subject disclosure. System 300 can comprise SSC 310 that can comprise parameterized testing nodes (PTNs) arranged in a tree structure. The PTNs can correspond to an example testing recipe that can comprise four degrees of freedom for a first operation, three degrees of freedom for a second operation, and three degrees of freedom for a third operation, e.g., recipe=(first operation (1 to 4), second operation (1-3), third operation (1-3)) such that the PTNs can extend from (1,1,1) to (4,3,3). Embodiments of the disclosed subject matter are able to employ other recipes that can be more or less complex than the example presented in system 300. These other recipes have more or less operations in a recipe, can include serial operations in a recipe, can have more or fewer degrees of freedom in one or more operations of a recipe, etc. As an example, another example recipe can comprise two operations each with two degrees of freedom, e.g., recipe=(first operation (1 to 2), second operation (1 to 2)) that can have PTNs for (1,1), (1,2), (2,1), and (2,2).

In illustrated example system 300 corresponding to the example testing recipe that can comprise four degrees of freedom for a first operation, three degrees of freedom for a second operations, and three degrees of freedom for a third operation such that the PTNs can extend from (1,1,1) to (4,3,3). The root node, PTN 3000, can then result in 36 iterations of the first operations corresponding to the 36 total test cases determined from the cumulative degrees of freedom, e.g., PTN 3000 can be first split according to the four degrees of freedom of the first operation, then spilt for the three degrees of freedom of the second operation, and then those splits can be again spilt for the three degrees of freedom of the third operation, for a total of 4×3×3=36 test cases. As such, assuming no test case failures, the first operation can actually be iteratively performed 36 times, e.g., once for each leaf node, the second operation can be performed 36 times, again once for each leaf node, and the third operation can be performed 36 times. The illustrated tree at system 300 is intended to convey the relationships between leaf nodes and the branching conditions, e.g., degrees of freedom at each operation, rather than an actual count of operation iterations. These iterations are not explicitly illustrated for the sake of clarity and brevity but said iterations can be understood to be performed to build a branch between the root and the leaf nodes of the tree. In a branch node at PTN 3001 that can correspond to the first operation using the first of the four possible parameters, e.g., first_operation('1'), a branch node PTN 3002 that can correspond to using the second parameter in the same operation, e.g., first_operation('2'), and similarly, PTN 3003 being a branch node for first_operation('3'), and PTN 3004 being a branch node for first_operation('4'). As is noted hereinabove, the operations are performed sequentially, although each branch is typically permitted to run ahead, for example, to a synchronization point. PTNs 3001-3004 can represent the four permutations of the first operation of the recipe. Accordingly, the permutations of the second or third example operation of the recipe are not immediately relevant to the processing of the branch extending from PTN 3001 until each of the permutations of the first operation, with regard to PTN 3001, are completed. In this respect, permutations of the second or third example operation can have different degrees of relevancy in other branches, for example branches from PTN 3002, etc., in conjunction with forward progress through test cases for those branches. It is again noted, there is no requirement that each of PTN 3001 to 3004 complete in the same time. In this regard, PTN 3001, for example, can complete several minutes before PTN 3002, whereby the second operation of the recipe can be performed with regard to PTN 3001 well before PTN 3002 completes the first operation. Extending this example, where PTN 3002 completes very slowly in comparison to PTN 3001 and later corresponding branches and leaves, it is possible that the branch for PTN 3001 can complete all the way to leaf PTN 3025 before PTN 3002 completes and moves to PTN 3008. This is typically completely permitted. In this particular example, there is no intervening synchronization point and so the recipes can run ahead to completion of the entire branch. Later examples can illustrate how synchronization points can affect recipe performance. In system 300, PTNs can be performed by one or more worker process of one or more WCs, however, discussion of WC assignment of PTNs is discussed elsewhere for the sake of clarity and brevity. System 300 is intended to primarily illustrate the determination of PTNs based on a recipe that has minimal complexity. It is noted that first_operation(1) in the example recipe can also be written as first_operation(1, x,x), recipe(first operation (1), second operation (x), third operation (x)), or in other similar manners. Accordingly, the example recipe can be said to cover PTN 3017 to 3052 that can correspond to every combination of recipe operations from [1,1,1] to [4,3,3] that corresponds to testing first_operation(1) to first_operation(4), then all dependencies through third_operation(4,3,3), for example, as illustrated by continuing the example hereinbelow.

System 300, for the sake of clarity and brevity, can complete the preceding example first operation of the example recipe. At this point, PTN 3001 to PTN 3004 can have completed and any failures can be recorded, e.g., recording the operation and the unique identifier for a failed PTN to facilitate reporting, e.g., via coordinated test results 222, etc., and or subsequent testing based on recreation of the failed test. As an example, if PTN 3004 is determined to have failed, then the failure can record, or store in memory, that first_operation(4,x,x) failed, which can uniquely identify the failed test at PTN 3004 against all other tests at other PTNs, e.g., first_operation(1,x,x) can correspond to PTN 3001, first_operation(2,x,x) can correspond to PTN 3002, first_operation(3,x,x) can correspond to PTN 3003, etc. In this regard, an example failure at PTN 3004 can result in not testing any branch/leaf nodes subsequent to PTN 3004, e.g., none of PTN 3014-3016, or PTN 3002-3052 would be tested where PTN 3004 fails. However, for clarity and brevity, in this example, all of PTN 3001-3004 can be considered to have successfully completed.

System 300 can advance to testing the second operation. Where the example second operation is noted to have three degrees of freedom, each of these degrees of freedom is cumulative to the degrees of freedom of preceding branch nodes, e.g., for each of PTN 3001 to 3004, three additional PTNs are tested for the second operation. This can be illustrated as PTN 3005, 3006, and 3007 for the second operation subsequent to the first operation generating PTN 3001, and can be written for example as, second_operation(1,1,x) for PTN 3005, second_operation(1,2,x) for PTN 3006, and second_operation(1,3,x) for PTN 3007. Here it is noted that the first parameter is consistently '1' indicating that each of the second operations depends from PTN 3001 that is associated with first_operation(1,x,x). Accordingly, second_operation(2,1,x) for PTN 3008, second_operation(2, 2,x) for PTN 3009, and second_operation(2,3,x) for PTN 3010 can be understood to all depend from PTN 3002. Similarly, second_operation(3,1,x) for PTN 3011, second_operation(3,2,x) for PTN 3012, and second_operation(3,3,x) for PTN 3013, second_operation(4,1,x) for PTN 3014, second_operation(4,2,x) for PTN 3015, and second_operation (3,3,x) for PTN 3016, are illustrated. As is noted hereinabove, not all branches need to complete in the same time. Further, as is also noted hereinabove, failed test cases can truncate additional testing for corresponding subsequent branches/leaves, as well as recording of the failed test case via recording the operation and unique identifier that failed.

In system 300, the running example can be extended to the third operation upon completion of performing the second operation that was performed upon completion of the first operation. As is illustrated, the example third operation can have three degrees of freedom. This can result in each successful PTN from the second operation can have three leaves, for example, PTN 3005 can have leaves PTN 3017, 3018, and 3019. Similarly, PTN 3006 can have leaves PTN 3020, 3021, and 3022. Likewise, PTN 3007 can have PTNs 3023 to 3024, PTNs 3008 to 3010 can encompass PTNs 3026 to 3034 for the third operation, PTNs 3011 to 3013 can encompass PTNs 3035 to 3043 for the third operation, and PTNs 3014 to 3016 can encompass PTNs 3044 to 3052 for the third operation. As an example, PTN 3017 can correspond to third_operation(1,1,1) and PTN 3052 can correspond to third_operation(4,3,3). Again, not all branches need to complete in the same time. Moreover, whereas the third operation is the final operation of this example recipe, failed test cases do not have subsequent operations to truncate, however, the failed leaves can still be recorded in the manner disclosed elsewhere herein.

At the PTNs, the indexed parameter can be resolved, for example via parameter component 150, via CC 120, 220, etc., to provide an argument to the then relevant operation. Accordingly, for the first operation, for example, four different arguments can be written to a parameter file. At runtime of the test recipe, PTN 3001 can perform the first operation with the argument corresponding to value '1' from the parameter file. Similarly, the PTN 3002 can use the argument corresponding to the value '2', PTN 3003 can use '3' and PTN 3004 can use argument '4' from the parameter file. It is further noted that the parameters can be held in memory rather than, or in addition to writing them to a file. In this example, upon the testing of a cases for the first operation completing, the second operation can be tested. Where we use PTN 3001 as an example, PTN 3005 to 3007 can be tested where the parameters for the second operation (1-3) can be retrieved. Similarly, using PTN 3005 as an example competed second operation of the recipe, the third operation can be tested, e.g., third operation with parameters (1-3) can be tested as PTNs 3017 to 3019, where the third operation parameters can be retrieved from the parameter file. It is further noted that the same three third operation parameters are similarly retrieved for each of the other third operations test cases under other branches, for example, PTN 3050 to 3052 can access the same third operation value from the parameter file for testing the third operation cases after successful completion of the second operation corresponding to PTN 3016 after the successful completion of the first operation corresponding to PTN 3004. The combinatorial nature of the testing can therefore be highly deterministic, and recordation of failed test cases can be compact and sufficiently complete to allow rebuilding of the entire test, while all typically being performed with substantially lower computing resource requirements, especially for very complex SUTs due to only active portions of the tree being loaded, reuse of interned operations in worker processes, and compact representation of operation arguments.

Figure 4:
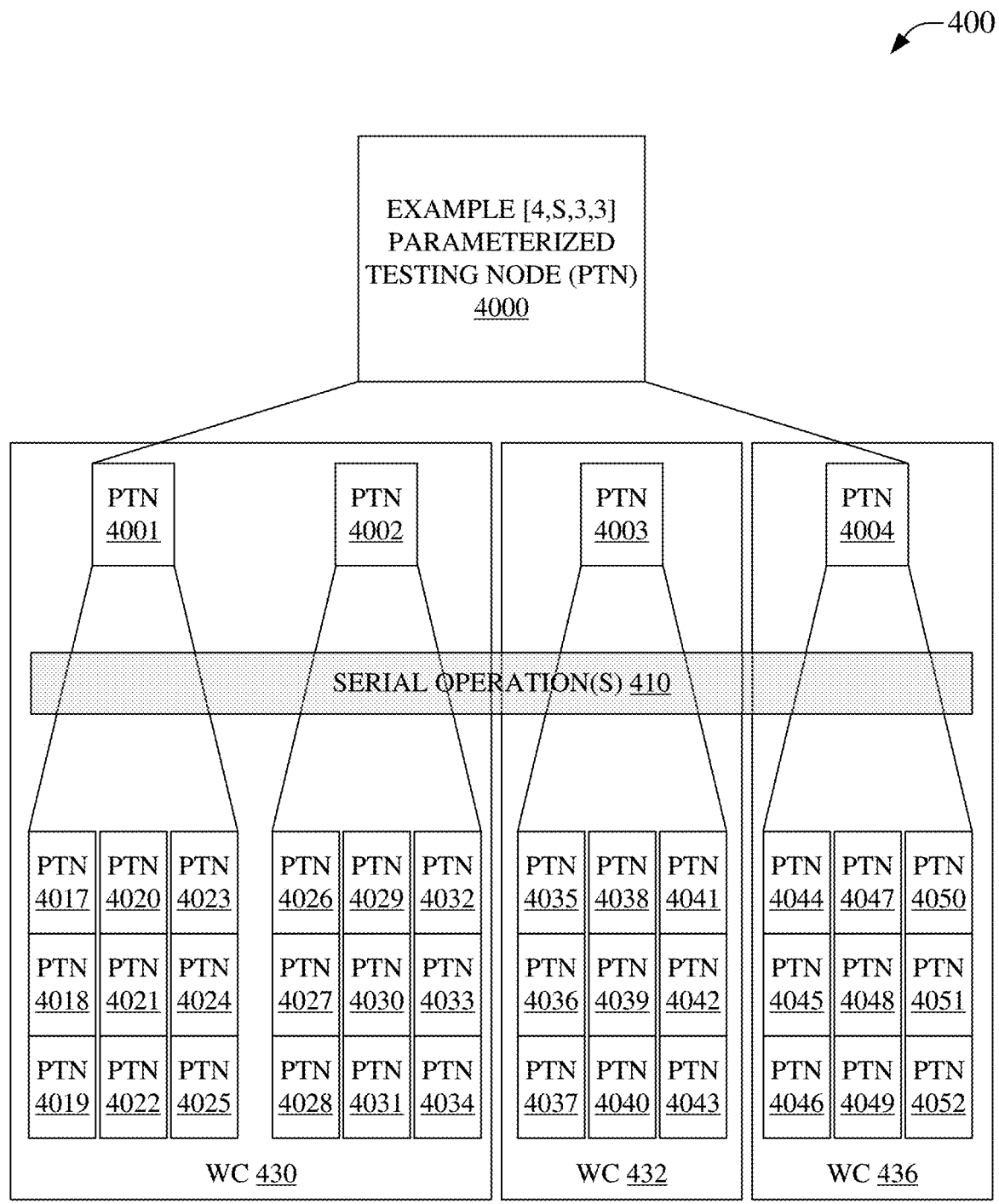
FIG. 4 is an illustration of an example system facilitating parameterized combinatoric testing with a synchronization point for use with a data storage system, in accordance with aspects of the subject disclosure.

FIG. 4 is an illustration of an example system 400, which can enable parameterized combinatoric testing with a synchronization point for use with a data storage system, in accordance with aspects of the subject disclosure. System 400 can comprise PTNs arranged in a tree structure. The PTNs can correspond to an example testing recipe that can comprise four degrees of freedom for a first operation, then a serial operation, then three degrees of freedom for a second operations, and three degrees of freedom for a third operation, e.g., recipe=(first operation (1 to 4), serial operation, second operation (1-3), third operation (1-3)) such that the PTNs can extend from (1, - - -, 1, 1) to (4, - - -, 3, 3), where the ' - - - ' indicates a serial operation that does not comprise any degrees of freedom and is applied to all tests, typically in a single operation. As an example, all first operations at each degree of freedom would complete and quiesce prior to performing the serial operation on the SUT, e.g., the serial operation would apply to all results of operation 1 of the recipe rather than being individually run on each test case. As is noted elsewhere herein, embodiments of the disclosed subject matter are able to employ other recipes that can be more or less complex than the example presented in system 400.

In illustrated example system 400 corresponding to the example testing recipe that can comprise four degrees of freedom for a first operation, a serial operation, three degrees of freedom for a second operation, and then three degrees of freedom for a third operation, the PTNs can extend from (1, - - -, 1, 1) to (4, - - -, 3, 3), the root node, PTN 4000 can first be split according to the four degrees of freedom corresponding to the first operation. It is noted that, similar to system 300, assuming no test case failures, the first operation can actually be iteratively performed 36 times, e.g., once for each leaf node, the second operation can be performed 36 times, again once for each leaf node, and the third operation can be performed 36 times, e.g., where N is the total degrees of freedom for a recipe, each operation can be iterated up to N times. As in system 300, these iterations are not explicitly illustrated for the sake of clarity and brevity, but the iterations can be understood to be performed to build a branch between the root and the leaf nodes of the tree. PTN 4001 to PTN 4004 can therefore demonstrate similar branching as PTN 3001 to 3004 of system 300. As is noted hereinabove, while the operations are performed sequentially and are typically permitted to run ahead, system 400 illustrates a synchronization point in the form of serial operation 410. PTNs 4001-4004 can represent the four permutations of the first operation of the recipe, e.g., first_operation(1, - - -, x, x) to (4, - - -, x, x). In this particular example, where PTN 4001 completes, this branch of testing is NOT permitted to advance to subsequent testing and must wait for PTNs 4002-to 4004 to complete. This waiting allows serial operation 410 to be applied once across all test cases represented by PTN 4001 to 4004. Upon completion of serial operation(s) 410, each branch can proceed to subsequent test cases.

System 400 can illustrate that the second and third operations can run ahead to the end because there are no further synchronization points in the example recipe, e.g., no further serial operations occur in the testing after serial operation(s) 410. In this regard, while the operations must still be completed in order, there is no need to specifically illustrate second operations as a distinct phase and the ordered combination of the second and third operations can be treated as a unified phase in the testing. As such in example system 400, there can be a first phase that comprises the first operations represented in PTN 4001 to 4004 and a second phase starting with serial operation(s) 410 and including the second and third operations iterations. Accordingly, the second phase can follow completion of the first phase. It is readily appreciated that the loading the first phase into memory can be less computing resource demanding that loading the entire tree, e.g., both the first and the second phases. Similarly, loading the second phase without the first phase can also be seen as less taxing on computing resources than loading the whole tree.

Where the second phase of example system 400 comprises the second and third operations, upon completing the second operations, the third operations can be promptly begun because branches of the testing topology are permitted to run ahead to the end where there are no further synchronization points. For brevity, this ability to run ahead is illustrated in example system 400 as PTN 4017 to 4025 being the second and third phases from PTN 4001 after serial operation(s) 410, PTN 4026 to 4034 being the second and third phases from PTN 4002 after serial operation(s) 410, PTN 4035 to 4043 being the second and third phases from PTN 4003 after serial operation(s) 410, and PTN 4044 to 4052 being the second and third phases from PTN 4004 after serial operation(s) 410. It is noted that where the second operation fails in any branch, pruning can occur. As an example, where the second operation corresponding to PTN 4017 fails, then no third operation for PTN 4017 would occur due to pruning. Similarly, in this example, failure of the second operation of PTN 4017 would correspond to identical failures for each of PTN 4018 and 4019 and, as such, these PTNs will similarly be pruned at the failure of the second operation at PTN 4017. This can be identical in logic to PTN 3005 of example system 300 failing, resulting in pruning of PTN 3017-3019. As before, failures can result in storing of an operation and a unique identifier for the failed PTN that can enable deterministic rebuilding of the failed test without needing to begin from the root and proceed to a failed PTN.

System 400 further illustrates that vertical division of testing for branches of the test tree that can enable reuse of interned operations. As an example, the example third operation can be loaded into WC 432 for testing at PTN 4035, e.g., third operation(3, - - -, 1, 1). Rather than loading a second instance of the third operation for testing at each of PTN 4036 to 4043, the third operation from PTN 4035 can be interned and reused, albeit with arguments corresponding to the relevant PTN, without loading separate instances of the third operation. This can save on consumption of valuable computing resources, for example, processors can pass around an interned instance of the third operation rather than having nine instances of the third operation, the bandwidth to retrieve the third operation from a recipe store can be reduced to one interned instance rather than nine individual instances, etc. Similarly, for WC 430, the third operation can be interned and used among the argument variations of each of PTNs 4107 to 4034. It is noted that where WC 430, WC 432, WC 436, etc., are distinct, each of these WCs can intern an instance of an operation, e.g., in example system 400, there can be three instance of the third operation with a first instance shared among PTN 4017 to 4034 at WC 430, a second instance among PTNs 4035 to 4043 at WC 432, a third instance among PTN 4044 to 4052 at WC 436, etc.

Figure 5:
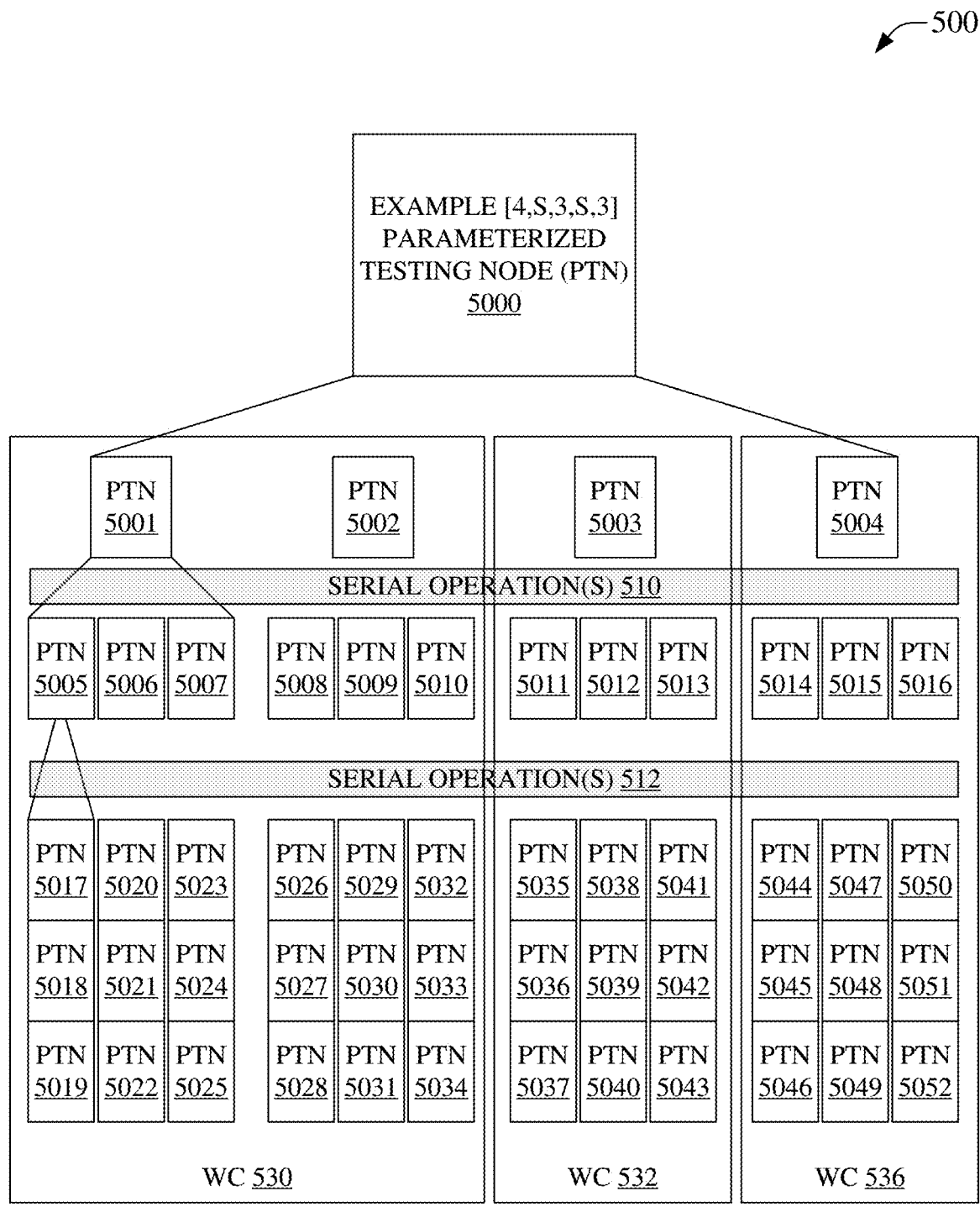
FIG. 5 is an illustration of an example system that can facilitate parameterized combinatoric testing with multiple synchronization points, in accordance with aspects of the subject disclosure.

FIG. 5 is an illustration of an example system 500, which can enable parameterized combinatoric testing with multiple synchronization points, in accordance with aspects of the subject disclosure. System 500 can again comprise PTNs arranged in a tree structure. It is again noted that similar to systems 300 and 400, assuming no test case failures, operations can be iteratively performed N times, where N is the total degrees of freedom of the test recipe, e.g., each operation can be performed once for each leaf node of a test tree model. As in systems 300 and 400, these iterations are not explicitly illustrated for the sake of clarity and brevity, but the iterations can be understood to be performed to build a branch between the root and the leaf nodes of the tree. The PTNs can correspond to another example testing recipe that can comprise four degrees of freedom for a first operation, then a serial operation, then three degrees of freedom for a second operations, then another serial operation, and three degrees of freedom for a third operation, e.g., recipe=(first operation (1 to 4), serial operation, second operation (1-3), serial operation, third operation (1-3)) such that the PTNs can extend from (1, - - - , 1, - - - , 1) to (4, - - - , 3, - - - , 3), where the ' - - - ' again indicates a serial operation(s) that does not comprise any degrees of freedom and is applied to all tests, typically in a single operation. As an example, all first operations at each degree of freedom would complete and quiesce prior to performing the serial operation on the SUT, then the second operation can run ahead to a second serial operation, followed by the third operation being allowed to run ahead to completion of the testing. As is noted elsewhere herein, embodiments of the disclosed subject matter are able to employ other recipes that can be more or less complex than the example presented in system 500.

In illustrated example system 500 corresponding to the example testing recipe that can comprise four degrees of freedom for a first operation, a serial operation, three degrees of freedom for a second operation, another serial operation, and then three degrees of freedom for a third operation, the PTNs can extend from (1, - - - , 1, - - - , 1) to (4, - - - , 3, - - - , 3), the root node, PTN 5000, can first be split according to the four degrees of freedom corresponding to the first operation. This can result in branch nodes PTN 5001 to PTN 5004, similar to that illustrated in systems 300, 400, etc. As is noted hereinabove, while the operations are performed sequentially and are typically permitted to run ahead, system 500 again illustrates a synchronization point in the form of serial operation(s) 510, and again later at serial operation(s) 512. PTNs 5001-5004 can represent the four permutations of the first operation of the recipe, e.g., first_operation(1, - - - , x, - - - , x) to (4, - - - , x, - - - , x). In this particular example, where PTN 5001 completes, this branch of testing is NOT permitted to advance to subsequent testing and must wait for PTNs 5002-to 5004 to complete. This waiting allows serial operation 510 to be applied once across all test cases represented by PTN 5001 to 5004. Upon completion of serial operation(s) 510, each branch can proceed to a subsequent operation(s).

System 500 can illustrate that the second operation can be performed subsequent to serial operation(s) 510 completing. As such, tests cases are again NOT allowed to run ahead to the third operation. In this particular example, where PTNs 5005 completes, this branch of testing is NOT permitted to advance to subsequent testing and must wait for PTNs 5006 to 5016 to complete. This waiting allows serial operation(s) 512 to be applied once across all test cases represented by PTNs 5005 to 5016. Upon completion of serial operation(s) 512, each branch can again proceed to a subsequent operation(s). In example system 500, there can be a first phase that comprises the first operations represented in PTN 5001 to 5004, a second phase comprising PTNs 5005 to 5016, and a third phase from PTN 5017 to 5052. Accordingly, the second phase can follow completion of the first phase, and the third phase can follow completion of the second phase. It is readily appreciated that the loading of a phase into memory can be less computing resource demanding that loading the entire tree. As before, failure at a PTN can be recorded and pruning can be applied. System 500, similar to system 400, can illustrates vertical division of testing. This can again enable interning of operations. As an example, system 500 can comprise a recipe that comprises a first write operation with four patterns of data to be written into an open file, a serial operation to move all files to another location, a second operation that reads data from the open file via one of three specific interfaces of the physical storage node, a serial operation that scales the values of the files, and a third operation that copies the data to one or three other storage locations. The moving of the data and the scaling of the data can be performed as serial operations on all the files in a batch process. The first, second, and third operations can perform variations associated with degrees of freedom, e.g., 4 degrees, 3, degrees, and 3 degrees correspondingly.

Figure 6:
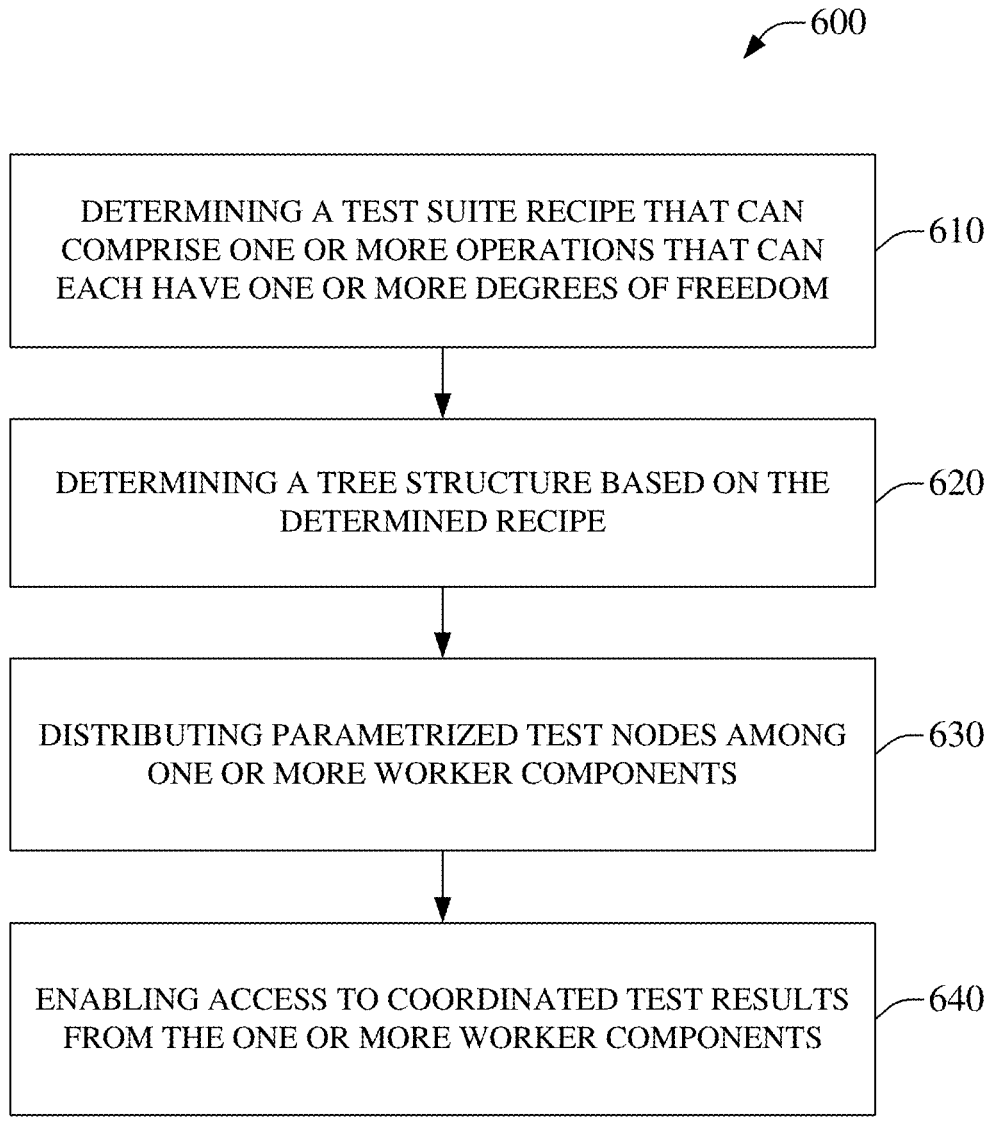
FIG. 6 is an illustration of an example method enabling parameterized testing of a data storage system, in accordance with aspects of the subject disclosure.
Figure 7:
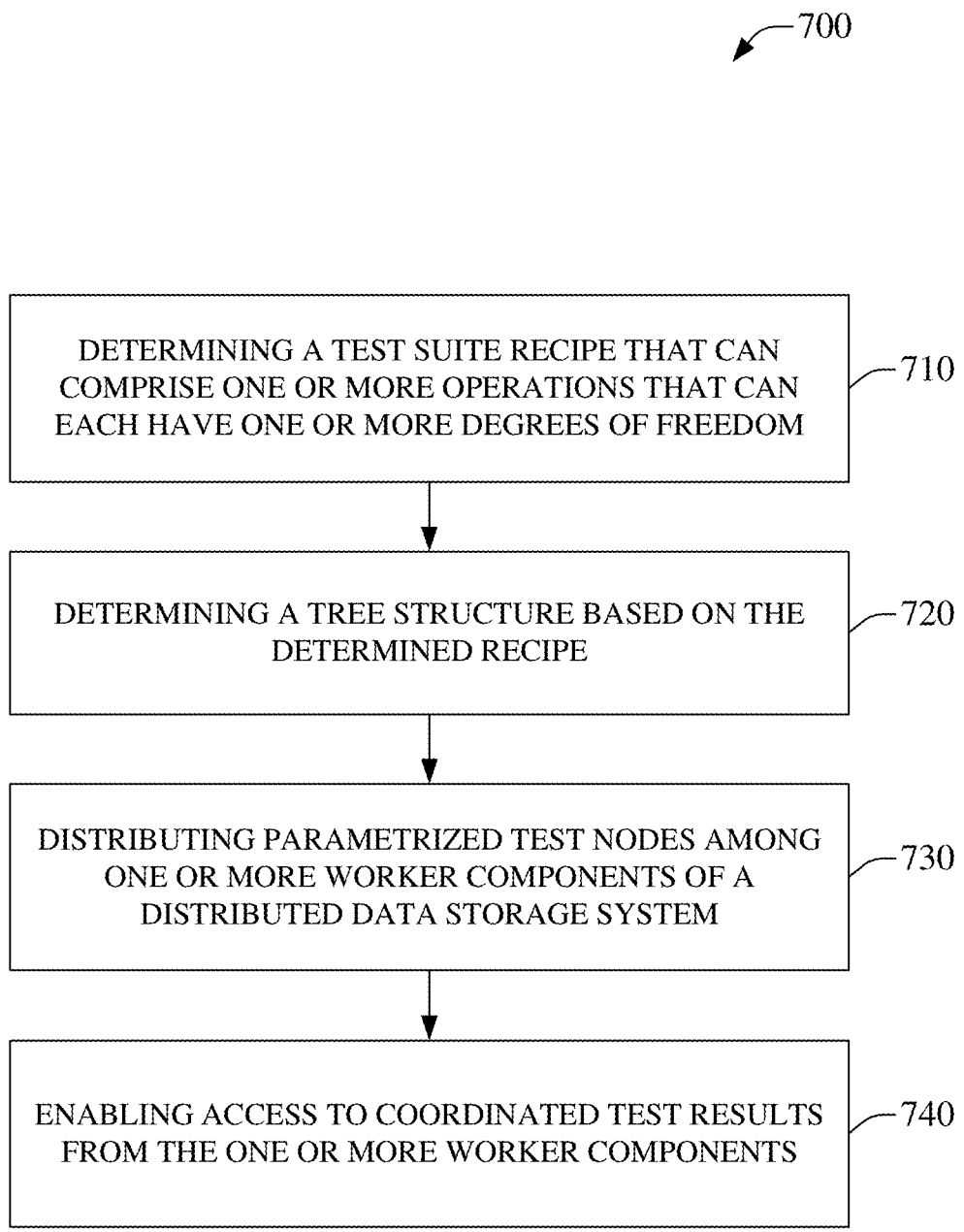
FIG. 7 is an illustration of an example method facilitating parameterized testing of a distributed data storage system, in accordance with aspects of the subject disclosure.
Figure 8:
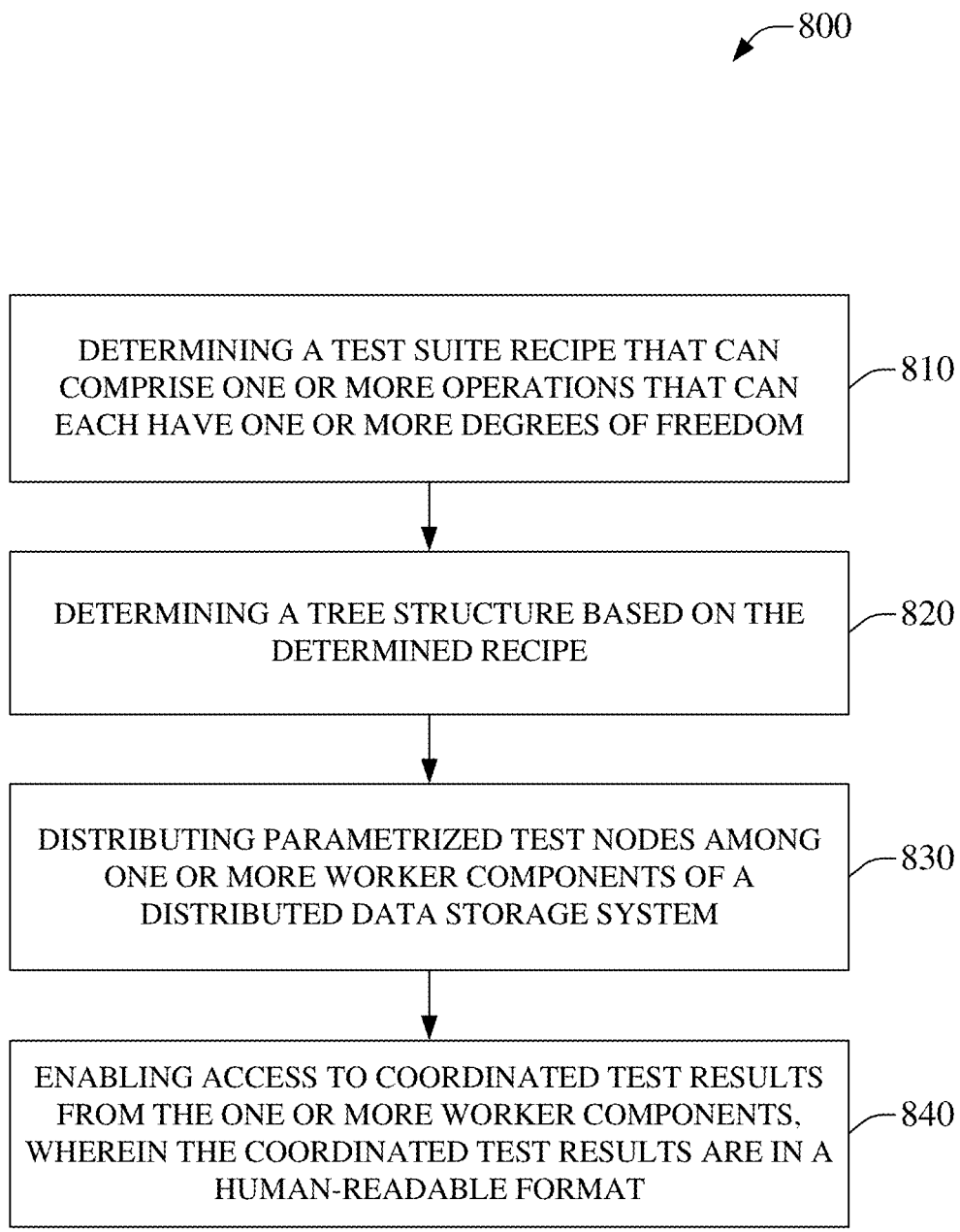
FIG. 8 is an illustration of an example method facilitating parameterized testing of a data storage system resulting in human-readable results, in accordance with aspects of the subject disclosure.

In view of the example system(s) described above, example method(s) that can be implemented in accordance with the disclosed subject matter can be better appreciated with reference to flowcharts in FIG. 6-FIG. 8. For purposes of simplicity of explanation, example methods disclosed herein are presented and described as a series of acts; however, it is to be understood and appreciated that the claimed subject matter is not limited by the order of acts, as some acts may occur in different orders and/or concurrently with other acts from that shown and described herein. For example, one or more example methods disclosed herein could alternately be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a described example method in accordance with the subject specification. Further yet, two or more of the disclosed example methods can be implemented in combination with each other, to accomplish one or more aspects herein described. It should be further appreciated that the example methods disclosed throughout the subject specification are capable of being stored on an article of manufacture (e.g., a computer-readable medium) to allow transporting and transferring such methods to computers for execution, and thus implementation, by a processor or for storage in a memory.

FIG. 6 is an illustration of an example method 600 that can facilitate parameterized testing of a data storage system, in accordance with aspects of the subject disclosure. At 610, method 600 can comprise determining a testing suite recipe. In embodiments, the recipe can be received from a recipe store, e.g., recipe component 140, etc. The recipe can comprise one or more operations that can accept permutations of an argument. The permutations can correspond to fixed integers and can correspond to degrees of freedom for the corresponding operation. Accordingly, the recipe can provide various unique combinations of operations and arguments. As an example, a recipe can comprise two operations that can each accept one of two arguments, e.g., each operation can be said to have two degrees of freedom.

For this example, the arguments can be 1, 2, 3, and 4, and Op1 can accept 1 or 2, while Op2 can accept 3 or 4. Accordingly, for this example, the combinations of operations and arguments can provide four different tests that can comprise Op1(1), Op2(3), Op1(2), Op2(3), Op1(1), Op2(4), Op1(2), Op2(4). In this recipe, the argument values can correspond to inputs defined in a file, e.g., 1=first pattern, 2=second pattern, 3=first location, 4=second location. As such, in the example, where the first operation is a write operation and the second operation is a move operation, the recipe can write the first pattern and then move it to the first location, write the second pattern and then move it to the first location, write the first pattern and then move it to the second location, and write the second pattern and then move it to the second location.

At 620, method 600 can determine a tree structure corresponding to a recipe received at 610. The tree topology can be based on the degrees of freedom of each subsequent operation of the recipe. As an example, system 300 can embody a recipe that can have a first operation with four degrees of freedom, a second operation that can have three degrees of freedom, and a third operation that can have three degrees of freedom. As such, a first level of a resulting tree for example system can have four parameterized testing nodes to enable testing of the four degrees of freedom of associated with the first operation of the recipe. These four degrees of freedom can therefore be embodied in PTN 3001 to 3004. The determined tree can further comprise a second tier where each node of the first tier then correspondingly has three nodes corresponding to the three degrees of freedom of the second operation of the recipe, which can be embodied in PTNs 3005 to 3016. Similarly, the third operations can result in three additional nodes populating a third tier of the tree and corresponding to each of the second tier PTNs, e.g., as PTNs 3017 to 3052.

At 630, the PTNs of the tree can be delegated to worker processes of worker components, e.g., WCs disclosed at length elsewhere herein, to facilitate testing. The branches of the tree are permitted to run in different times, although the recipe is to be followed in order and branches are not permitted to run past and synchronization points. A synchronization point is typically associated with a serial operation(s) of the recipe. A serial operation(s) is performed on all test cases and, as such, the serial operation(s) cannot be performed until all test cases have complete preceding operations of the recipe. It is noted that failing a test case can satisfy completing a proceeding operation. As an example, if a recipe comprises ten operations, then a serial operation, then additional other operations, if a first branch fails at the second operation, then the subsequent branching of the tree is pruned, and that branch need not complete all ten operations before the serial operation can be performed. However, where another brand of the example tree quickly completes all ten operations and arrives at the serial operation, the branch is not permitted to advance to the additional operations via the serial operation until all other branches, sans the failed branches, also arrive at the serial operation, e.g., the serial operation acts as a synchronization point. At this example synchronization point, all un-failed branches can quiesce until the serial operation can be performed once for all surviving test cases, after which, the remaining branches can process to the next operations after the serial operation. This can be regarded as dividing the tree horizontally into phases. In this example, the first ten operations can be a first phase and the subsequent operations, including the serial operation, can be comprise in a second phase. Accordingly, in this example, the first phase must be completed prior to permitting the second phase of testing to begin.

At 640, result of the testing can be coordinated and made accessible. At this point method 600 can end. Failed test cases can be reported, typically in the form of an operation and the unique index value of the PTN where it failed. The remaining tests cases can be presumed to have succeeded. As such, the recorded failed test cases can be employed to rebuild the entire test. Moreover, the unique PTN value and the operation can allow directly rebuilding the failed operation without needing to traverse the entire tree to recreate each individual preceding operation. As is noted elsewhere herein, the compact reporting structure of failed test cases can also improve computing resource use efficiency in comparison to conventional techniques. Further, the user of parametric arguments for operations can enable WCs to quickly access appropriate arguments from a centralized file. Further, WCs can be selected to allow interning of operations, e.g., an operation can be instantiated at a worker that can then reuse the instantiation for other test cases reducing the need to have multiple instances of the instantiated operation where operations are randomly distributed rather than being distributed in accord with the test tree.

FIG. 7 is an illustration of an example method 700 that can facilitate parameterized testing of a distributed data storage system, in accordance with aspects of the subject disclosure. At 710, method 700 can comprise receiving a testing suite recipe. The recipe can comprise one or more operations that can accept permutations of an argument. The permutations can correspond to fixed integers and can correspond to degrees of freedom for the corresponding operation. Accordingly, the recipe can provide various unique combinations of operations and arguments. The recipe can be applied to a distributed storage system, e.g., a storage system than can comprise physical storage nodes in different and remote locations, e.g., different cities, different states, different countries, etc. Accordingly, performing the recipe can be associated with distributing test cases within the distributed storage system, e.g., WCs can be located remotely from other WCs.

At 720, method 700 can determine a tree structure corresponding to a recipe received at 710. The tree topology can be based on the degrees of freedom of each subsequent operation of the recipe. This can be readily appreciated in system 400, of FIG. 4, wherein the root PTN 4000 can embody a recipe that can have a first operation with four degrees of freedom, a second operation that can have three degrees of freedom, and a third operation that can have three degrees of freedom. The example first level of the tree can therefore be embodied in PTN 4001 to 4004. As previously discussed, the serial operations(s) 410 of the recipe can then stall progression to a second phase of testing until competition of the first phase of testing, e.g., PTNs 4017 to 4052 cannot be tested until PTNs 4001-4004 can completed, or failed, and serial operation(s) 410 have been performed. This can be viewed as horizontal division of tree phases.

At 730, the PTNs of the tree can be vertically divided among worker processes of worker components, e.g., WCs, of the distributed data storage system. In some embodiments, method 700 can assign branches to local and remote WCs of the storage system in a round robin manner, or some other manner that attempts to approach an even distribution of work among remotely located WCs. As an example, where there are only three WCs available in the storage system, and where the first two variants of the first operation, e.g., represented as PTN 4001 and 4002, can be comparatively simple in contrast to the variants of the first operation at PTN 4003 and PTN 4004, method 700 can place both branches from PTN 4001 and 4002 with one WC in an attempt to balance workload from testing at the various WCs. In another example, WC 430 can be local to the test controller, e.g., CC 120, 220, etc., and network resources can accommodate performing more work local, whereby more branches are kept local, e.g., branch from PTN 4001 and 4002 are kept local to reduce burden on the networking resource. However, it is noted that method 700 can implement more advanced scheduling of test case branches, for example, to intentionally test some components of a storage system by disproportionate or inefficient allocation of test cases to portions of the physical storage system, etc. As an example, adding a new storage cluster to a storage system can include combinatoric testing that specifically targets the new cluster resources. Whereas method 700 can address distributed storage systems, at 720, method can include geographic distribution of test cases, e.g., test cases performing on WCs located remotely form each other.

As before, the branches of the tree are permitted to run in different times, although the recipe is to be followed in order and branches are not permitted to run past and synchronization points. A synchronization point is typically associated with a serial operation(s) of the recipe. A serial operation(s) is performed on all test cases and, as such, the serial operation(s) cannot be performed until all test cases have complete preceding operations of the recipe. It is noted that failing a test case can satisfy completing a proceeding operation. Dividing the tree horizontally can correspond to dividing the tree into operational phases, whereby the whole tree does not need to be implemented. Rather, the method can implement only active phases of the tree in an iterative manner to conserve computing resources. A first phase must be completed prior to permitting a second phase of testing to begin.

At 740, result of the testing can be coordinated and made accessible. At this point method 700 can end. Failed test cases can be reported, typically in the form of an operation and the unique index value of the PTN where it failed. The remaining tests cases can be presumed to have succeeded. As such, the recorded failed test cases can be employed to rebuild the entire test. Moreover, the unique PTN value and the operation can allow directly rebuilding the failed operation without needing to traverse the entire tree to recreate each individual preceding operation. As is noted elsewhere herein, the compact reporting structure of failed test cases can also improve computing resource use efficiency in comparison to conventional techniques. Further, the user of parametric arguments for operations can enable WCs to quickly access appropriate arguments from a centralized file. Further, WCs can be selected to allow interning of operations, e.g., an operation can be instantiated at a worker that can then reuse the instantiation for other test cases reducing the need to have multiple instances of the instantiated operation where operations are randomly distributed rather than being distributed in accord with the test tree.

FIG. 8 is an illustration of an example method 800, which can enable parameterized testing of a data storage system resulting in human-readable results, in accordance with aspects of the subject disclosure. At 810, method 800 can comprise receiving a testing suite recipe. The recipe can comprise one or more operations that can accept permutations of an argument. The permutations can correspond to fixed integers and can correspond to degrees of freedom for the corresponding operation. Accordingly, the recipe can provide various unique combinations of operations and arguments. The recipe can be applied to a distributed storage system, e.g., a storage system than can comprise physical storage nodes in different and remote locations, e.g., different cities, different states, different countries, etc. Accordingly, performing the recipe can be associated with distributing test cases within the distributed storage system, e.g., WCs can be located remotely from other WCs.

At 820, method 800 can determine a tree structure corresponding to a recipe received at 810. The tree topology can be based on the degrees of freedom of each subsequent operation of the recipe. This can be readily appreciated in system 400, of FIG. 4, wherein the root PTN 4000 can embody a recipe that can have a first operation with four degrees of freedom, a second operation that can have three degrees of freedom, and a third operation that can have three degrees of freedom. The example first level of the tree can therefore be embodied in PTN 4001 to 4004. As previously discussed, the serial operations(s) 410 of the recipe can then stall progression to a second phase of testing until competition of the first phase of testing, e.g., PTNs 4017 to 4052 cannot be tested until PTNs 4001-4004 can completed, or failed, and serial operation(s) 410 have been performed. This can be viewed as horizontal division of tree phases.

At 830, the PTNs of the tree can be vertically divided among worker processes of worker components, e.g., WCs, of the distributed data storage system. In some embodiments, method 800 can assign branches to local and remote WCs of the storage system in a round robin manner, or some other manner that attempts to approach an even distribution of work among remotely located WCs. As an example, where there are only three WCs available in the storage system, and where the first two variants of the first operation, e.g., represented as PTN 4001 and 4002, can be comparatively simple in contrast to the variants of the first operation at PTN 4003 and PTN 4004, method 800 can place both branches from PTN 4001 and 4002 with one WC in an attempt to balance workload from testing at the various WCs. In another example, WC 430 can be local to the test controller, e.g., CC 120, 220, etc., and network resources can accommodate performing more work local, whereby more branches are kept local, e.g., branch from PTN 4001 and 4002 are kept local to reduce burden on the networking resource. However, it is noted that method 800 can implement more advance soloing of test case branches, for example, to intentionally test some components of a storage system by disproportionate or inefficient allocation of test cases to portions of the physical storage system, etc. As an example, adding a new storage cluster to a storage system can include combinatoric testing that specifically targets the new cluster resources. Whereas method 800 can address distributed storage systems, at 820, method can include As before, the branches of the tree are permitted to run in different times, although the recipe is to be followed in order and branches are not permitted to run past and synchronization points. A synchronization point is typically associated with a serial operation(s) of the recipe. A serial operation(s) is performed on all test cases and, as such, the serial operation(s) cannot be performed until all test cases have complete preceding operations of the recipe. It is noted that failing a test case can satisfy completing a proceeding operation. Dividing the tree horizontally can correspond to dividing the tree into operational phases, whereby the whole tree does not need to be implemented. Rather, the method can implement only active phases of the tree in an iterative manner to conserve computing resources. A first phase must be completed prior to permitting a second phase of testing to begin.

At 840, result of the testing can be coordinated and made accessible in a human-readable format. At this point method 800 can end. Failed test cases can be reported, typically in the form of an operation and the unique index value of the PTN where it failed. The remaining tests cases can be presumed to have succeeded. As such, the recorded failed test cases can be employed to rebuild the entire test. Moreover, the unique PTN value and the operation can allow directly rebuilding the failed operation without needing to traverse the entire tree to recreate each individual preceding operation. Additionally, coordinated test results can, where possible, be accessible in human-readable format, for example, ["write", 1, 232] can indicate that a write operation took the '1' argument and failed at PTN corresponding to combination of the $2^{nd}$ variant of the $3^{rd}$ variant of the $2^{nd}$ variant of the root, which, in system 300 can map to PTN 4033. This human-readable reporting of failed test cases can allow an engineer to quickly rerun the failure and to expand on testing around the failure to better characterize the bug. As is noted elsewhere herein, the compact reporting structure of failed test cases can also improve computing resource use efficiency in comparison to conventional techniques. Further, the user of parametric arguments for operations can enable WCs to quickly access appropriate arguments from a centralized file. Further, WCs can be selected to allow interning of operations, e.g., an operation can be instantiated at a worker that can then reuse the instantiation for other test cases reducing the need to have multiple instances of the instantiated operation where operations are randomly distributed rather than being distributed in accord with the test tree.

Figure 9:
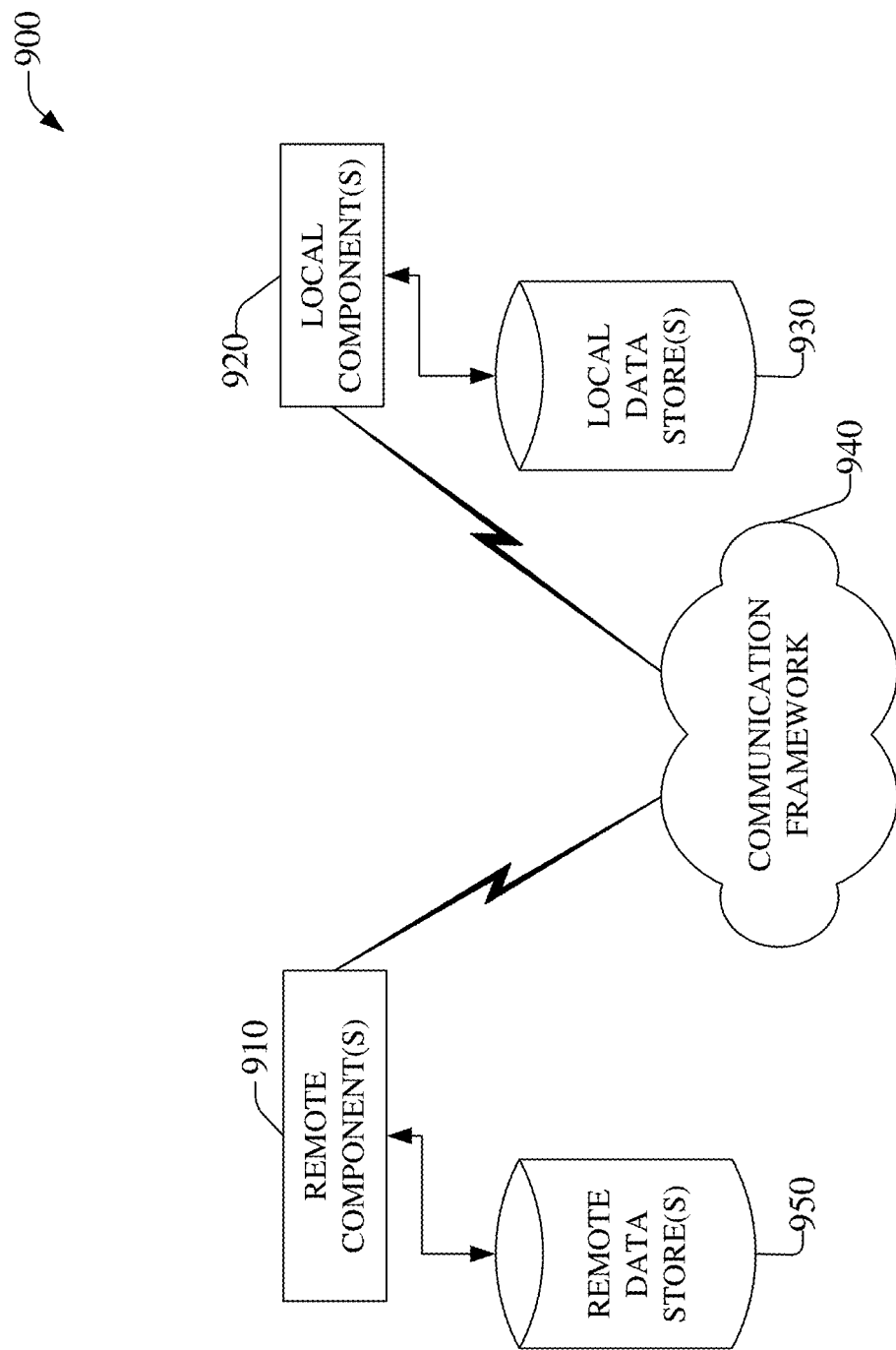
FIG. 9 depicts an example schematic block diagram of a computing environment with which the disclosed subject matter can interact.

FIG. 9 is a schematic block diagram of a computing environment 900 with which the disclosed subject matter can interact. The system 900 comprises one or more remote component(s) 910. The remote component(s) 910 can be hardware and/or software (e.g., threads, processes, computing devices). In some embodiments, remote component(s) 910 can be a remotely located storage system component (SSC) 110, 112, 114, 230, 236, etc., a remotely located processor device comprised in recipe component 140, etc., a remotely located device comprised in parameter component 150, etc., or other remotely located devices, which can be connected to a local component via communication framework 940. Communication framework 940 can comprise wired network devices, wireless network devices, mobile devices, wearable devices, radio access network devices, gateway devices, femtocell devices, servers, etc.

The system 900 also comprises one or more local component(s) 920. The local component(s) 920 can be hardware and/or software (e.g., threads, processes, computing devices). In some embodiments, local component(s) 920 can comprise a local device comprised in remotely located in SSC 110, 112, 114, 230, 236, etc., a local processor device comprised in recipe component 140, etc., a local device comprised in parameter component 150, etc., or other locally located devices.

One possible communication between a remote component(s) 910 and a local component(s) 920 can be in the form of a data packet adapted to be transmitted between two or more computer processes. Another possible communication between a remote component(s) 910 and a local component(s) 920 can be in the form of circuit-switched data adapted to be transmitted between two or more computer processes in radio time slots. The system 900 comprises a communication framework 940 that can be employed to facilitate communications between the remote component(s) 910 and the local component(s) 920, and can comprise an air interface, e.g., Uu interface of a UMTS network, via a long-term evolution (LTE) network, etc. Remote component(s) 910 can be operably connected to one or more remote data store(s) 950, such as a hard drive, solid state drive, SIM card, device memory, etc., that can be employed to store information on the remote component(s) 910 side of communication framework 940. Similarly, local component(s) 920 can be operably connected to one or more local data store(s) 930, that can be employed to store information on the local component(s) 920 side of communication framework 940. As examples, test case parameters, states, interned operations, etc., generated by SCC 110, 220, etc., of storage systems 100-500, etc., can be communicated via communication framework 940 among storage components of a storage system, etc., e.g., to combinatoric testing, as disclosed herein.

Figure 10:
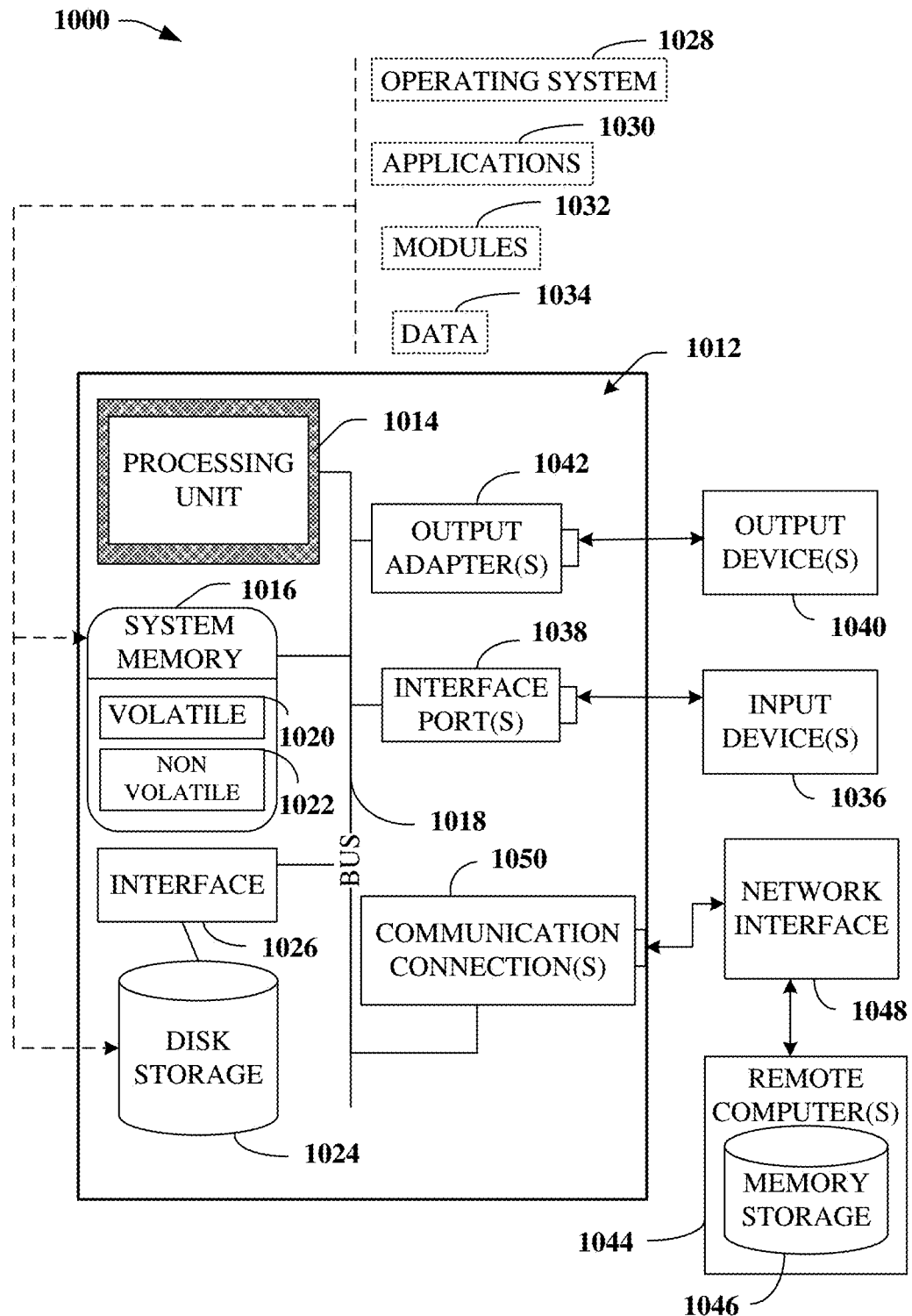
FIG. 10 illustrates an example block diagram of a computing system operable to execute the disclosed systems and methods in accordance with an embodiment.

In order to provide a context for the various aspects of the disclosed subject matter, FIG. 10, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc. that performs particular tasks and/or implement particular abstract data types.

In the subject specification, terms such as "store," "storage," "data store," data storage," "database," and substantially any other information storage component relevant to operation and functionality of a component, refer to "memory components," or entities embodied in a "memory" or components comprising the memory. It is noted that the memory components described herein can be either volatile memory or nonvolatile memory, or can comprise both volatile and nonvolatile memory, by way of illustration, and not limitation, volatile memory 1020 (see below), nonvolatile memory 1022 (see below), disk storage 1024 (see below), and memory storage 1046 (see below). Further, nonvolatile memory can be included in read only memory, programmable read only memory, electrically programmable read only memory, electrically erasable read only memory, or flash memory. Volatile memory can comprise random access memory, which acts as external cache memory. By way of illustration and not limitation, random access memory is available in many forms such as synchronous random-access memory, dynamic random-access memory, synchronous dynamic random-access memory, double data rate synchronous dynamic random-access memory, enhanced synchronous dynamic random-access memory, SynchLink dynamic random-access memory, and direct Rambus random access memory. Additionally, the disclosed memory components of systems or methods herein are intended to comprise, without being limited to comprising, these and any other suitable types of memory.

Moreover, it is noted that the disclosed subject matter can be practiced with other computer system configurations, comprising single-processor or multiprocessor computer systems, mini-computing devices, mainframe computers, as well as personal computers, hand-held computing devices (e.g., personal digital assistant, phone, watch, tablet computers, netbook computers, . . . ), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

FIG. 10 illustrates a block diagram of a computing system 1000 operable to execute the disclosed systems and methods in accordance with an embodiment. Computer 1012, which can be, for example, comprised in any of storage system component (SSC) 110, 112, 114, 230, 236, etc., recipe component 140, etc., parameter component 150, etc., worker selection component 280, etc., or other components of systems 100-500, can comprise a processing unit 1014, a system memory 1016, and a system bus 1018. System bus 1018 couples system components comprising, but not limited to, system memory 1016 to processing unit 1014. Processing unit 1014 can be any of various available processors. Dual microprocessors and other multiprocessor architectures also can be employed as processing unit 1014.

System bus 1018 can be any of several types of bus structure(s) comprising a memory bus or a memory controller, a peripheral bus or an external bus, and/or a local bus using any variety of available bus architectures comprising, but not limited to, industrial standard architecture, microchannel architecture, extended industrial standard architecture, intelligent drive electronics, video electronics standards association local bus, peripheral component interconnect, card bus, universal serial bus, advanced graphics port, personal computer memory card international association bus, Firewire (Institute of Electrical and Electronics Engineers 1194), and small computer systems interface.

System memory 1016 can comprise volatile memory 1020 and nonvolatile memory 1022. A basic input/output system, containing routines to transfer information between elements within computer 1012, such as during start-up, can be stored in nonvolatile memory 1022. By way of illustration, and not limitation, nonvolatile memory 1022 can comprise read only memory, programmable read only memory, electrically programmable read only memory, electrically erasable read only memory, or flash memory. Volatile memory 1020 comprises read only memory, which acts as external cache memory. By way of illustration and not limitation, read only memory is available in many forms such as synchronous random-access memory, dynamic read only memory, synchronous dynamic read only memory, double data rate synchronous dynamic read only memory, enhanced synchronous dynamic read only memory, SynchLink dynamic read only memory, Rambus direct read only memory, direct Rambus dynamic read only memory, and Rambus dynamic read only memory.

Computer 1012 can also comprise removable/non-removable, volatile/non-volatile computer storage media. FIG. 10 illustrates, for example, disk storage 1024. Disk storage 1024 comprises, but is not limited to, devices like a magnetic disk drive, floppy disk drive, tape drive, flash memory card, or memory stick. In addition, disk storage 1024 can comprise storage media separately or in combination with other storage media comprising, but not limited to, an optical disk drive such as a compact disk read only memory device, compact disk recordable drive, compact disk rewritable drive or a digital versatile disk read only memory. To facilitate connection of the disk storage devices 1024 to system bus 1018, a removable or non-removable interface is typically used, such as interface 1026.

Computing devices typically comprise a variety of media, which can comprise computer-readable storage media or communications media, which two terms are used herein differently from one another as follows.

Machine-readable storage media, which can include any computer-readable storage media, can be any available storage media that can be accessed by the machine or computer and can comprise both volatile and nonvolatile media, and removable and non-removable media. By way of example, and not limitation, machine-readable storage media can be implemented in connection with any method or technology for storage of information such as computer-readable instructions, program modules, structured data, or unstructured data. Machine-readable storage media can comprise, but are not limited to, read only memory, programmable read only memory, electrically programmable read only memory, electrically erasable read only memory, flash memory or other memory technology, compact disk read only memory, digital versatile disk or other optical disk storage, magnetic cassettes, magnetic tape, magnetic disk storage or other magnetic storage devices, or other tangible media which can be used to store desired information. In this regard, the term "tangible" herein as may be applied to storage, memory, or computer-readable media, is to be understood to exclude only propagating intangible signals per se as a modifier and does not relinquish coverage of all standard storage, memory or computer-readable media that are not exclusively propagating intangible signals per se. In an aspect, tangible media can comprise non-transitory media wherein the term "non-transitory" herein as may be applied to storage, memory, or computer-readable media, is to be understood to exclude only propagating transitory signals per se as a modifier and does not relinquish coverage of all standard storage, memory or computer-readable media that are not exclusively propagating transitory signals per se. Machine-readable storage media can be accessed by one or more local or remote computing devices, e.g., via access requests, queries, or other data retrieval protocols, for a variety of operations with respect to the information stored by the medium. As such, for example, a machine-readable medium can comprise executable instructions stored thereon that, in response to execution, can cause a system comprising a processor to perform operations comprising determining a test recipe for combinatoric testing of a distributed data storage system. A phased testing tree topology can then be determined based on the test recipe. Test cases can then be distributed to distributed worker processes of the distributed data storage system in accord with the phased test tree, and performance of test cases represented in individual phases of the phased test tree topology can be coordinated without loading the entire phased test tree topology into memory. The operations can then comprise storing failure information that corresponds to failed test cases.

Communications media typically embody machine-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

It can be noted that FIG. 10 describes software that acts as an intermediary between users and computer resources described in suitable operating environment 1000. Such software comprises an operating system 1028. Operating system 1028, which can be stored on disk storage 1024, acts to control and allocate resources of computer system 1012. System applications 1030 take advantage of the management of resources by operating system 1028 through program modules 1032 and program data 1034 stored either in system memory 1016 or on disk storage 1024. It is to be noted that the disclosed subject matter can be implemented with various operating systems or combinations of operating systems.

A user can enter commands or information into computer 1012 through input device(s) 1036. In some embodiments, a user interface can allow entry of user preference information, etc., and can be embodied in a touch sensitive display panel, a mouse/pointer input to a graphical user interface (GUI), a command-line controlled interface, etc., allowing a user to interact with computer 1012. Input devices 1036 comprise, but are not limited to, a pointing device such as a mouse, trackball, stylus, touch pad, keyboard, microphone, joystick, game pad, satellite dish, scanner, TV tuner card, digital camera, digital video camera, web camera, cell phone, smartphone, tablet computer, etc. These and other input devices connect to processing unit 1014 through system bus 1018 by way of interface port(s) 1038. Interface port(s) 1038 comprise, for example, a serial port, a parallel port, a game port, a universal serial bus, an infrared port, a Bluetooth port, an IP port, or a logical port associated with a wireless service, etc. Output device(s) 1040 use some of the same type of ports as input device(s) 1036.

Thus, for example, a universal serial bus port can be used to provide input to computer 1012 and to output information from computer 1012 to an output device 1040. Output adapter 1042 is provided to illustrate that there are some output devices 1040 like monitors, speakers, and printers, among other output devices 1040, which use special adapters. Output adapters 1042 comprise, by way of illustration and not limitation, video and sound cards that provide means of connection between output device 1040 and system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. Remote computer(s) 1044 can be a personal computer, a server, a router, a network PC, cloud storage, a cloud service, code executing in a cloud-computing environment, a workstation, a microprocessor-based appliance, a peer device, or other common network node and the like, and typically comprises many or all of the elements described relative to computer 1012. A cloud computing environment, the cloud, or other similar terms can refer to computing that can share processing resources and data to one or more computer and/or other device(s) on an as needed basis to enable access to a shared pool of configurable computing resources that can be provisioned and released readily. Cloud computing and storage solutions can store and/or process data in third-party data centers which can leverage an economy of scale and can view accessing computing resources via a cloud service in a manner similar to a subscribing to an electric utility to access electrical energy, a telephone utility to access telephonic services, etc.

For purposes of brevity, only a memory storage device 1046 is illustrated with remote computer(s) 1044. Remote computer(s) 1044 is logically connected to computer 1012 through a network interface 1048 and then physically connected by way of communication connection 1050. Network interface 1048 encompasses wire and/or wireless communication networks such as local area networks and wide area networks. Local area network technologies comprise fiber distributed data interface, copper distributed data interface, Ethernet, Token Ring, and the like. Wide area network technologies comprise, but are not limited to, point-to-point links, circuit-switching networks like integrated services digital networks and variations thereon, packet switching networks, and digital subscriber lines. As noted below, wireless technologies may be used in addition to or in place of the foregoing.

Communication connection(s) 1050 refer(s) to hardware/software employed to connect network interface 1048 to bus 1018. While communication connection 1050 is shown for illustrative clarity inside computer 1012, it can also be external to computer 1012. The hardware/software for connection to network interface 1048 can comprise, for example, internal and external technologies such as modems, comprising regular telephone grade modems, cable modems and digital subscriber line modems, integrated services digital network adapters, and Ethernet cards.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions described herein. Processors can exploit nano-scale architectures such as, but not limited to, molecular and quantum-dot based transistors, switches, and gates, in order to optimize space usage or enhance performance of user equipment. A processor may also be implemented as a combination of computing processing units.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. Moreover, the use of any particular embodiment or example in the present disclosure should not be treated as exclusive of any other particular embodiment or example, unless expressly indicated as such, e.g., a first embodiment that has aspect A and a second embodiment that has aspect B does not preclude a third embodiment that has aspect A and aspect B. The use of granular examples and embodiments is intended to simplify understanding of certain features, aspects, etc., of the disclosed subject matter and is not intended to limit the disclosure to said granular instances of the disclosed subject matter or to illustrate that combinations of embodiments of the disclosed subject matter were not contemplated at the time of actual or constructive reduction to practice.

Further, the term "include" is intended to be employed as an open or inclusive term, rather than a closed or exclusive term. The term "include" can be substituted with the term "comprising" and is to be treated with similar scope, unless otherwise explicitly used otherwise. As an example, "a basket of fruit including an apple" is to be treated with the same breadth of scope as, "a basket of fruit comprising an apple."

Furthermore, the terms "user," "subscriber," "customer," "consumer," "prosumer," "agent," and the like are employed interchangeably throughout the subject specification, unless context warrants particular distinction(s) among the terms. It should be appreciated that such terms can refer to human entities, machine learning components, or automated components (e.g., supported through artificial intelligence, as through a capacity to make inferences based on complex mathematical formalisms), that can provide simulated vision, sound recognition and so forth.

Aspects, features, or advantages of the subject matter can be exploited in substantially any, or any, wired, broadcast, wireless telecommunication, radio technology or network, or combinations thereof. Non-limiting examples of such technologies or networks comprise broadcast technologies (e.g., sub-Hertz, extremely low frequency, very low frequency, low frequency, medium frequency, high frequency, very high frequency, ultra-high frequency, super-high frequency, extremely high frequency, terahertz broadcasts, etc.); Ethernet; X.25; powerline-type networking, e.g., Powerline audio video Ethernet, etc.; femtocell technology; Wi-Fi; worldwide interoperability for microwave access; enhanced general packet radio service; second generation partnership project (2G or 2GPP); third generation partnership project (3G or 3GPP); fourth generation partnership project (4G or 4GPP); long term evolution (LTE); fifth generation partnership project (5G or 5GPP); third generation partnership project universal mobile telecommunications system; third generation partnership project 2; ultra mobile broadband; high speed packet access; high speed downlink packet access; high speed uplink packet access; enhanced data rates for global system for mobile communication evolution radio access network; universal mobile telecommunications system terrestrial radio access network; or long term evolution advanced. As an example, a millimeter wave broadcast technology can employ electromagnetic waves in the frequency spectrum from about 30 GHz to about 300 GHz. These millimeter waves can be generally situated between microwaves (from about 1 GHz to about 30 GHz) and infrared (IR) waves, which are sometimes referred to extremely high frequency (EHF). The wavelength ($\lambda$) for millimeter waves is typically in the 1-mm to 10-mm range.

The term "infer", or "inference" can generally refer to the process of reasoning about, or inferring states of, the system, environment, user, and/or intent from a set of observations as captured via events and/or data. Captured data and events can include user data, device data, environment data, data from sensors, sensor data, application data, implicit data, explicit data, etc. Inference, for example, can be employed to identify a specific context or action, or can generate a probability distribution over states of interest based on a consideration of data and events. Inference can also refer to techniques employed for composing higher-level events from a set of events and/or data. Such inference results in the construction of new events or actions from a set of observed events and/or stored event data, whether the events, in some instances, can be correlated in close temporal proximity, and whether the events and data come from one or several event and data sources. Various classification schemes and/or systems (e.g., support vector machines, neural networks, expert systems, Bayesian belief networks, fuzzy logic, and data fusion engines) can be employed in connection with performing automatic and/or inferred action in connection with the disclosed subject matter.

What has been described above includes examples of systems and methods illustrative of the disclosed subject matter. It is, of course, not possible to describe every combination of components or methods herein. One of ordinary skill in the art may recognize that many further combinations and permutations of the claimed subject matter are possible. Furthermore, to the extent that the terms "includes," "has," "possesses," and the like are used in the detailed description, claims, appendices, and drawings such terms are intended to be inclusive in a manner similar to the term "comprising" as "comprising" is interpreted when employed as a transitional word in a claim.

What is claimed is:

1. A system, comprising:
a processor; and
a memory that stores executable instructions that, when executed by the processor, facilitate performance of operations, comprising:
determining test recipe data representative of a test recipe for combinatoric testing of a data storage system;
determining topology data representative of a phased testing tree topology associated with a phased test tree based on the test recipe data;
distributing test cases to worker processes based on the phased test tree, wherein the distributing of the test cases to the worker processes is performed for a phase of the phased testing tree topology loaded into the memory, and wherein the phased testing tree topology is not loaded entirely into the memory; and
storing failure information corresponding to failed test cases.

2. The system of claim 1, wherein the test recipe comprises a plurality of operations.

3. The system of claim 2, wherein an operation of the plurality of operations is associated with a first argument and a second argument, wherein the first and second arguments are different arguments and wherein, when the operation is performed in accord with the first argument, a first result occurs that is different from a second result corresponding to performing the operation in accord with the second argument.

4. The system of claim 1, wherein the phased testing tree topology is divisible into phases separated by a synchronization point.

5. The system of claim 4, wherein the synchronization point corresponds to a serial operation that is to be performed on all surviving test cases subsequent to completion of a preceding phase of the phased testing tree topology.

6. The system of claim 1, wherein the data storage system is not a distributed data storage system, and wherein the worker processes are located local to the processor of the system.

7. The system of claim 1, wherein the data storage system is a distributed data storage system, and wherein the worker processes are located local to the processor of the system.

8. The system of claim 1, wherein the data storage system is a distributed data storage system, and wherein a worker process of the worker processes is located remotely from the processor of the system.

9. The system of claim 1, wherein the test cases are identified via respective unique identifiers corresponding to combinatoric parameters of the operations comprised in the test recipe.

10. The system of claim 1, wherein the storing of the failure information comprises storing human-readable failure information.

11. The system of claim 1, wherein the storing of the failure information facilitates regenerating all test cases resulting from the test recipe.

12. The system of claim 1, wherein the storing of the failure information enables regenerating a failed test case without traversing the phased test tree from a root node to a failed node corresponding to the failed test case.

13. The system of claim 1, wherein the distributing of the test cases to the worker processes comprises determining a distribution that maintains parameterized testing nodes of a branch of the phased testing tree topology at a same worker process to enable interning of an operation of the test recipe at the same worker process.

14. The system of claim 1, wherein testing test cases in accord with the phased test tree results in a failed test case of the failed test cases, and wherein the phased test tree is pruned in response to the failed test case.

15. A method, comprising:
receiving, by a system comprising a processor, a test recipe for combinatoric testing of a data storage system;
determining, by the system, a topology of a phased test tree based on the test recipe, wherein the topology is divisible into phases separated by a serial operation comprised in the test recipe;
distributing, by the system, test cases to worker processes in accord with the phased test tree;
coordinating, by the system, performance of test cases represented in each phase of the topology without loading all phases of the topology concurrently into memory; and
storing, by the system, failure information corresponding to failed test cases resulting from iteratively undergoing performance in each phase of the phased test tree.

16. The method of claim 15, wherein the data storage system is a distributed data storage system, and wherein the distributing of the test cases comprises distributing the test cases to the worker processes distributed among physical nodes of the distributed data storage system.

17. The method of claim 15, wherein the coordinating of the performance of the test cases comprises performing an interned instance of an operation, wherein the interned instance is selected based on a unique identifier of a test case of the test cases, and wherein the unique identifier corresponds to combinatoric parameter values of operations comprised in the test recipe.

18. A non-transitory machine-readable medium, comprising executable instructions that, when executed by a processor, facilitate performance of operations, comprising:
determining a test recipe for combinatoric testing of a distributed data storage system;
determining a phased testing tree topology corresponding to a phased test tree based on the test recipe;
distributing test cases to distributed worker processes of the distributed data storage system in accord with the phased test tree;
coordinating performance of test cases represented in individual phases of the phased testing tree topology without loading the phased test tree topology entirely into memory; and
storing failure information corresponding to failed test cases resulting from iteratively performing each phase of the phased test tree.

19. The non-transitory machine-readable medium of claim 18, wherein a serial operation comprised in the test recipe is treated as a synchronization point of the test recipe, and wherein the serial operation corresponds to a division between different phases of the phased testing tree topology.

20. The non-transitory machine-readable medium of claim 18, wherein the test recipe comprises a plurality of operations.

* * * * *